(12) United States Patent
Hatakeyama et al.

(10) Patent No.: US 9,136,122 B2
(45) Date of Patent: *Sep. 15, 2015

(54) UNDERLAYER FILM-FORMING COMPOSITION AND PATTERN FORMING PROCESS

(71) Applicant: Shin-Etsu Chemical Co., Ltd., Tokyo (JP)

(72) Inventors: Jun Hatakeyama, Joetsu (JP); Daisuke Kori, Joetsu (JP); Tsutomu Ogihara, Joetsu (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/296,241

(22) Filed: Jun. 4, 2014

(65) Prior Publication Data

US 2014/0363958 A1 Dec. 11, 2014

(30) Foreign Application Priority Data

Jun. 11, 2013 (JP) ................................. 2013-122844

(51) Int. Cl.
| | |
|---|---|
| *G03F 7/20* | (2006.01) |
| *C08G 8/04* | (2006.01) |
| *H01L 21/027* | (2006.01) |
| *H01L 21/266* | (2006.01) |
| *G03F 7/09* | (2006.01) |
| *G03F 7/42* | (2006.01) |
| *G03F 7/075* | (2006.01) |
| *G03F 7/11* | (2006.01) |

(52) U.S. Cl.
CPC ............. *H01L 21/0276* (2013.01); *C08G 8/04* (2013.01); *G03F 7/091* (2013.01); *G03F 7/094* (2013.01); *G03F 7/425* (2013.01); *H01L 21/266* (2013.01); *G03F 7/0752* (2013.01); *G03F 7/11* (2013.01)

(58) Field of Classification Search
CPC .............. H01L 21/0276; H01L 21/266; H01L 21/31155; G03F 7/20; G03F 7/425; G03F 7/0752; G03F 7/091

See application file for complete search history.

(56) References Cited

U.S. PATENT DOCUMENTS

| | | | |
|---|---|---|---|
| 5,332,648 A | 7/1994 | Kihara et al. | |
| 5,756,254 A * | 5/1998 | Kihara et al. | ............. 430/270.1 |

(Continued)

FOREIGN PATENT DOCUMENTS

| | | |
|---|---|---|
| EP | 0 609 684 B1 | 4/2000 |
| JP | 05-134415 A | 5/1993 |

(Continued)

OTHER PUBLICATIONS

Guerrero et al.,"A New Generation of Bottom Anti-Reflective Coatings (BARCs): Photodefinable BARCs", Proceedings of SPIE, vol. 5039, 2003, pp. 129-135; cited in the Specification.

(Continued)

*Primary Examiner* — Brittany Raymond
(74) *Attorney, Agent, or Firm* — Westerman, Hattori, Daniels & Adrian, LLP

(57) ABSTRACT

In lithography, a composition comprising a novolak resin comprising recurring units derived from a naphtholphthalein is used to form a photoresist underlayer film. The underlayer film is strippable in alkaline water, without causing damage to ion-implanted Si substrates or $SiO_2$ substrates.

18 Claims, 2 Drawing Sheets

(56) References Cited

U.S. PATENT DOCUMENTS

| | | | |
|---|---|---|---|
| 5,939,235 | A | 8/1999 | Kondo et al. |
| 6,136,500 | A | 10/2000 | Kobayashi et al. |
| 6,200,725 | B1 | 3/2001 | Takechi et al. |
| 6,312,867 | B1 | 11/2001 | Kinsho et al. |
| 7,214,743 | B2 | 5/2007 | Hatakeyama et al. |
| 7,303,855 | B2 | 12/2007 | Hatakeyama et al. |
| 7,358,025 | B2 | 4/2008 | Hatakeyama |
| 7,416,833 | B2 | 8/2008 | Hatakeyama et al. |
| 7,510,820 | B2 | 3/2009 | Hatakeyama et al. |
| 7,537,880 | B2 | 5/2009 | Harada et al. |
| 7,601,483 | B2 | 10/2009 | Guerrero et al. |
| 7,632,624 | B2 | 12/2009 | Hatakeyama et al. |
| 7,687,223 | B2 | 3/2010 | Takei et al. |
| 7,745,104 | B2 | 6/2010 | Hatakeyama et al. |
| 8,088,554 | B2 | 1/2012 | Hatakeyama |
| 8,338,078 | B2 | 12/2012 | Hatakeyama et al. |
| 8,501,393 | B2 | 8/2013 | Hatanaka et al. |
| 2008/0153030 | A1 | 6/2008 | Kobayashi et al. |
| 2010/0273321 | A1* | 10/2010 | Wang et al. ............... 438/514 |
| 2011/0124134 | A1* | 5/2011 | Lin et al. ................... 438/14 |
| 2012/0171379 | A1 | 7/2012 | Echigo et al. |
| 2013/0056653 | A1 | 3/2013 | Hatakeyama et al. |
| 2013/0056654 | A1 | 3/2013 | Hatakeyama et al. |

FOREIGN PATENT DOCUMENTS

| | | |
|---|---|---|
| JP | 06-230574 A | 8/1994 |
| JP | 09-73173 A | 3/1997 |
| JP | 2000-336121 A | 12/2000 |
| JP | 2001-226430 A | 8/2001 |
| JP | 2004-205658 A | 7/2004 |
| JP | 2004-205676 A | 7/2004 |
| JP | 2004-205685 A | 7/2004 |
| JP | 2004-271838 A | 9/2004 |
| JP | 2004-354554 A | 12/2004 |
| JP | 2005-010431 A | 1/2005 |
| JP | 2005-049810 A | 2/2005 |
| JP | 2005-114921 A | 4/2005 |
| JP | 2005-128509 A | 5/2005 |
| JP | 2005-250434 A | 9/2005 |
| JP | 2006-053543 A | 2/2006 |
| JP | 2006-096848 A | 4/2006 |
| JP | 3790646 B2 | 6/2006 |
| JP | 2006-227391 A | 8/2006 |
| JP | 2006-259249 A | 9/2006 |
| JP | 2006-259482 A | 9/2006 |
| JP | 2006-285095 A | 10/2006 |
| JP | 2006-293207 A | 10/2006 |
| JP | 2006-293298 A | 10/2006 |
| JP | 2007-017950 A | 1/2007 |
| JP | 2007-140461 A | 6/2007 |
| JP | 2007-171895 A | 7/2007 |
| JP | 2007-199653 A | 8/2007 |
| JP | 3991462 B2 | 10/2007 |
| JP | 2007-316282 A | 12/2007 |
| JP | 2007-536389 A | 12/2007 |
| JP | 2008-501985 A | 1/2008 |
| JP | 2008-026600 A | 2/2008 |
| JP | 2008-065303 A | 3/2008 |
| JP | 2008-096684 A | 4/2008 |
| JP | 2008-111103 A | 5/2008 |
| JP | 2008-116677 A | 5/2008 |
| JP | 2008-145539 A | 6/2008 |
| JP | 2008-158339 A | 7/2008 |
| JP | 2008-257188 A | 10/2008 |
| JP | 2010-134437 A | 6/2010 |
| JP | 2010-160189 A | 7/2010 |
| JP | 2010-170013 A | 8/2010 |
| JP | 2010-271654 A | 12/2010 |
| WO | 2005/093513 A2 | 10/2005 |
| WO | 2005/111724 A1 | 11/2005 |
| WO | 2006/049046 A1 | 5/2006 |

OTHER PUBLICATIONS

Extended European Search Report dated Nov. 28, 2014, issued in corresponding European Application No. 14171729.8. (10 pages).

* cited by examiner

COATING OF UNDERLAYER FILM

COATING OF SILICON-CONTAINING INTERMEDIATE FILM

COATING OF RESIST FILM

EXPOSURE OF RESIST FILM

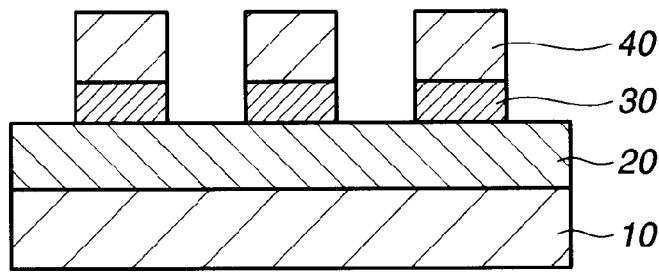
FIG.2E — RESIST PATTERN FORMATION VIA PEB AND DEVELOPMENT
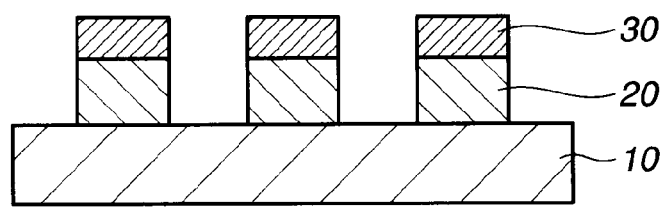
FIG.2F — PROCESSING OF UNDERLAYER FILM BY H₂ GAS DRY ETCHING
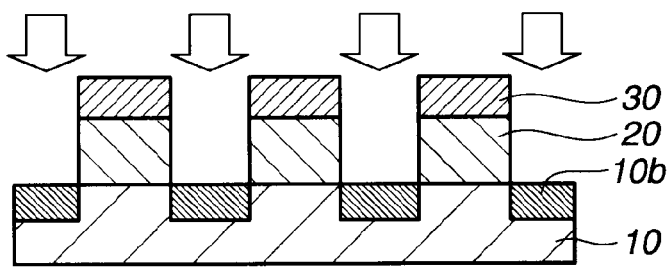
FIG.2G — ION IMPLANTATION INTO SUBSTRATE
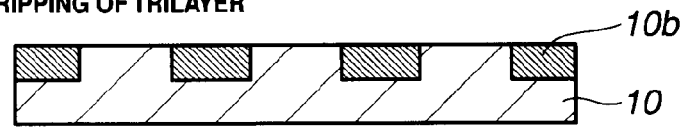
FIG.2H — STRIPPING OF TRILAYER

UNDERLAYER FILM-FORMING COMPOSITION AND PATTERN FORMING PROCESS

CROSS-REFERENCE TO RELATED APPLICATION

This non-provisional application claims priority under 35 U.S.C. §119(a) on Patent Application No. 2013-122844 filed in Japan on Jun. 11, 2013, the entire contents of which are hereby incorporated by reference.

TECHNICAL FIELD

This invention relates to an underlayer film-forming composition and a process for forming a pattern in a substrate using the same.

BACKGROUND ART

Recently, CMOS devices are fabricated, in some cases, by performing ion implantation through a mask of KrF resist film to form p- and n-wells. As the size of resist patterns is reduced, more attention is paid to ArF resist films. For further miniaturization, ArF immersion lithography is proposed. The substrate surface must be bare in spaces of a resist film before ion implantation can be carried out. This is because if a bottom antireflection coating (BARC) layer is present below the resist film, ions are trapped by the BARC layer. However, if the photoresist film is patterned in the absence of BARC layer, standing waves are generated due to substrate reflection, resulting in substantial corrugations in the sidewall of resist pattern after development. For the purpose of smoothing out a corrugated profile due to standing waves, it is believed effective to use a photoacid generator (PAG) capable of generating a low molecular weight acid amenable to more acid diffusion or to apply high-temperature PEB because acid diffusion is enhanced by either means. In the size range of 200 to 300 nm where the resist film for ion implantation is resolved by KrF lithography, resolution is not degraded by the enhancement of acid diffusion. In the size range of less than 200 nm where the resist film for ion implantation is resolved by ArF lithography, however, the enhancement of acid diffusion is undesirable because resolution is degraded or proximity bias is enlarged by acid diffusion.

It was contemplated that the substrate surface to be ion implanted is made bare by placing a BARC film as a layer beneath a resist film, developing the resist film to form a resist pattern, and dry etching the BARC film with the resist pattern made mask. In this approach, soft dry etching is employed so that the substrate may not be altered, for the reason that if the substrate is oxidized to form an oxide layer, ions can be trapped by this portion. Specifically, dry etching with hydrogen gas is used because the substrate can be oxidized by dry etching with oxygen gas. Then a BARC having a high dry etching rate with hydrogen gas is required.

A dyed resist material is the most traditional technique, which is based on the concept that a photoresist film itself is made absorptive for preventing generation of standing waves, and has been investigated since the age of i or g-line novolak resist materials. As the absorptive component used in ArF lithography, a study was made on a base polymer having benzene ring introduced therein or an additive having benzene ring. However, the absorptive component is insufficient to completely prevent standing waves. Increased absorption is effective for reducing standing waves, but gives rise to the problem that the resist pattern becomes tapered, i.e., of trapezoidal profile in cross section.

It was also contemplated to provide a top antireflection coating (TARC) film as an upper-layer on the resist film. The TARC is effective for reducing standing waves, but not for preventing halation due to irregularities on the substrate. Ideally the refractive index of TARC is equal to the square root of the refractive index of the photoresist film. However, since the methacrylate used in the ArF resist film has a relatively low refractive index of 1.7 at wavelength 193 nm, there are available no materials having a low refractive index equal to its square root, 1.30.

Then a study was made on BARC which is dissolved in developer (see Proc. SPIE Vol. 5039, p 129 (2003)). At the initial, the study was directed to BARC which is anisotropically dissolved in developer. This approach was difficult in size control in that with the excess progress of dissolution, the resist pattern is undercut, and with short dissolution, residuals are left in spaces. Next the study was made on photosensitive BARC. In order that a film function as BARC, it must have an antireflective effect, remain insoluble in a photoresist solution which is coated thereon, and avoid intermixing with the photoresist film. If the BARC is crosslinked during post-application bake of BARC solution, it is possible to prevent the BARC from dissolution in the photoresist solution and intermixing therewith.

As the crosslinking mechanism during post-application bake, JP-A H06-230574 discloses to use vinyl ethers as the crosslinker. Specifically, a vinyl ether crosslinker is blended with hydroxystyrene, whereby crosslinking takes place during prebake after coating, forming a resist film which is insoluble in alkaline developer. Thermal reaction between vinyl ether group and phenol group creates an acetal group. The PAG generates an acid upon exposure. Then the acetal group is deprotected with the aid of acid, water and heat. The film functions as a positive resist film in that the exposed region is alkali soluble. This mechanism is applicable to dissolvable bottom antireflection coating (DBARC) as described in WO 2005/111724 and JP-A 2008-501985.

A substrate to be ion implanted has surface irregularities (or raised and recessed portions). The BARC becomes thicker on a recessed portion of the substrate. When DBARC is applied to a flat substrate, in the exposed region, the BARC film is dissolved in alkaline developer simultaneously with the photoresist film. When DBARC is applied to a stepped substrate, there arises a problem that the DBARC film on the recessed portion is not dissolved. Since DBARC has strong absorption, light does not reach the bottom as the DBARC film becomes thicker, so that the amount of acid generated by PAG in the DBARC is reduced. Particularly the thicker portion of DBARC film above the step is less sensitive to light in its proximity to the substrate and thus less dissolvable.

It is also contemplated to apply the trilayer process to ion implantation. In this case, a bottom layer of hydrocarbon is coated on a substrate and crosslinked during bake, a silicon-containing intermediate layer is coated thereon and crosslinked during bake, and a photoresist material is coated thereon. A resist pattern is formed via exposure and development. With the resist pattern made mask, the silicon-containing intermediate layer is dry etched with fluorocarbon gas. With the silicon-containing intermediate layer made mask, the bottom layer is processed by dry etching. With the bottom layer made mask, ions are implanted into the substrate. Although the dry etching for processing the bottom layer typically uses oxygen gas, dry etching with hydrogen gas capable of avoiding oxide formation is preferred for the reason that the substrate surface, if oxidized, becomes an ion stop during ion implantation, as discussed above. The trilayer process can prevent reflection off the substrate completely, so that the resist pattern on its sidewall may not be provided with any corrugations due to standing waves. Where a silsesquioxane-based SOG film is used as the silicon-containing intermediate layer, the SOG film having a high silicon content exhibits a high etching rate during dry etching of the silicon-containing intermediate layer with the resist pattern made mask and a slow etching rate during etching of the bottom layer, that is, exerting an excellent hard mask function, but suffers from the problem that it is not amenable to solution stripping after ion implantation. While the SOG intermediate layer is typically removed with hydrofluoric acid, the use of hydrofluoric acid causes significant damage to the substrate which is a silicon oxide film.

Substrate cleaning solutions which are commonly used in the art include an aqueous solution of ammonia and aqueous hydrogen peroxide (known as SC1), an aqueous solution of hydrochloric acid and aqueous hydrogen peroxide (known as SC2), and an aqueous solution of sulfuric acid and aqueous hydrogen peroxide (known as SPM). Most often, SC1 is used for cleaning of organic matter and metal oxide film, SC2 for removal of metal contamination, and SPM for removal of organic film. SOG film cannot be stripped with these cleaners. The SOG film is removed by dry etching with CF base gas and cleaning with dilute hydrofluoric acid or a combination of dilute hydrofluoric acid and SPM, and the carbon underlayer film is removed by dry etching with oxygen or hydrogen gas or cleaning with SPM. When oxygen gas etching or SPM solution stripping is applied to the stripping of the underlayer film on a substrate which is a Si substrate, the substrate surface is oxidized into $SiO_2$. Once the surface of Si substrate is converted to $SiO_2$, the electrical conductivity is reduced to such an extent that the semiconductor may not perform. In contrast, the hydrogen gas etching does not oxidize the substrate, but has a slow etching rate, failing to remove phosphorus and arsenic present in the underlayer film after ion implantation. There is a need for an underlayer film which is solution strippable so that any concern about oxidation of the substrate surface is eliminated.

Many photoresist compositions having phenolphthalein, Phenol Red, Cresolphthalein, Cresol Red, Thymolphthalein or naphtholphthalein added thereto are known from JP-A H05-134415, for example. If brought in contact with alkaline water, the phenolphthalein, Phenol Red, Cresolphthalein, Cresol Red, Thymolphthalein or naphtholphthalein undergoes ring opening to create a carboxyl group in the case of phenolphthalein and naphtholphthalein or a sulfo group in the case of Phenol Red. Through this mechanism, the alkali dissolution rate of the resist film is improved.

CITATION LIST

Patent Document 1: JP-A H06-230574 (U.S. Pat. No. 5,939,235, EP 0609684)
Patent Document 2: WO 2005/111724
Patent Document 3: JP-A 2008-501985 (WO 2005/093513)
Patent Document 4: WO 2006/049046
Patent Document 5: JP-A 2007-017950
Patent Document 6: JP-A H05-134415 (U.S. Pat. No. 5,332,648)
Non-Patent Document 1: Proc. SPIE Vol. 5039, p 129 (2003)

Disclosure of Invention

When the photoresist film is used in the ion implantation process, the substrate surface must be bared in the exposed region of resist film at the time of ion implantation so that ions may be implanted into the bare region of substrate. Since a silicon substrate is used as the substrate, substantial reflection occurs on the substrate. Although TARC is effective for suppressing standing waves, it allows some standing waves to generate because there is not available an optimum low-refraction material capable of completely suppressing standing waves, and it is not effective for suppressing diffuse reflection (or halation) on an irregular substrate surface. A resist film loaded with an absorbing component has a tendency that if absorption is strong, it is effective for suppressing substrate reflection, but the pattern becomes of tapered profile, and if absorption is weak enough to avoid a tapered profile, the effect of suppressing substrate reflection is reduced so that corrugations may result from standing waves. BARC has a very high antireflection effect because reflection is suppressed by two effects, light absorption by an absorber and offset of incident light and reflected light by a choice of an optimum film thickness. However, the BARC surface is bared after development, preventing ion implantation into the bulk of substrate. Photosensitive DBARC has the problem that since it has an increased film thickness on a recessed portion of a stepped substrate, this thick film portion is left undissolved. Where non-photosensitive BARC is used, the pattern of resist film after development may be transferred by dry etching. In this case, the etching rate of BARC must be higher than that of resist film.

The trilayer process has the problem that when a silsesquioxane base SOG film is used as the silicon-containing intermediate film, the SOG film cannot be stripped without causing damage to the ion implanted substrate. A silicon pendant type intermediate film is strippable after ion implantation, but suffers from a low selectivity during dry etching of the silicon-containing intermediate film with the resist pattern made mask, because of the low silicon content.

Typical of the stripper solution which does not cause the substrate surface to be oxidized is an alkaline aqueous solution. If an underlayer film which is strippable with alkaline aqueous solution is available, then it may be stripped without causing damage to the substrate.

Therefore, an object of the invention is to provide an underlayer film-forming composition, especially adapted for the ion implantation process, which is strippable with basic aqueous solution, typically ammonia hydrogen peroxide solution, and a pattern forming process using the same.

The invention provides an underlayer film-forming composition and a pattern forming process, as defined below.

In one aspect, the invention provides a photoresist underlayer film-forming composition for use in lithography, comprising a novolak resin comprising recurring units derived from a substituted or unsubstituted naphtholphthalein.

In a preferred embodiment, the recurring units have the general formula (1).

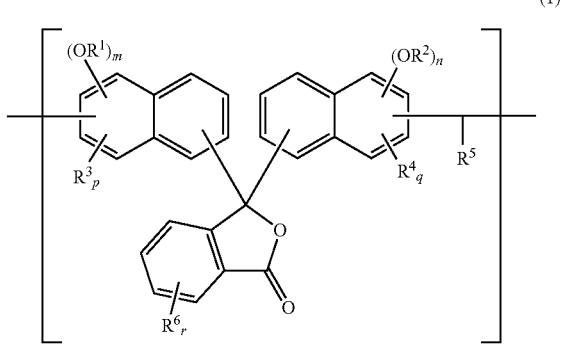

(1)

Herein $R^1$ and $R^2$ are independently hydrogen, an acid labile group, glycidyl group, or a straight, branched or cyclic $C_1$-$C_{10}$ alkyl, acyl or alkoxycarbonyl; $R^3$, $R^4$ and $R^6$ are independently hydrogen, or a straight, branched or cyclic $C_1$-$C_{10}$ alkyl, $C_2$-$C_{10}$ alkenyl, or $C_6$-$C_{10}$ aryl group, which may have a hydroxyl, alkoxy, acyloxy, ether or sulfide moiety, or a halogen atom, hydroxyl group or $C_1$-$C_4$ alkoxy group; $R^5$ is hydrogen, or a straight, branched or cyclic $C_1$-$C_6$ alkyl, a straight, branched or cyclic $C_2$-$C_{10}$ alkenyl, or $C_6$-$C_{12}$ aryl group, which may have a hydroxyl, alkoxy, ether, thioether, carboxyl, alkoxycarbonyl, acyloxy, —COOR or —OR moiety, wherein R is a lactone ring, acid labile group, or —R'—COOR", wherein R' is a single bond or alkylene group, and R" is an acid labile group; m, n, p, q and r each are 1 or 2.

In a preferred embodiment, the underlayer film-forming composition may further comprise an organic solvent and more preferably an acid generator and/or crosslinker.

In another aspect, the invention provides:

a process for forming a pattern in a substrate by lithography, comprising the steps of applying the underlayer film-forming composition defined above onto a substrate to form an underlayer film, forming a photoresist film on the underlayer film, forming a photoresist pattern via exposure and development, and processing the underlayer film and the substrate with the photoresist pattern serving as mask;

a process for forming a pattern in a substrate by lithography, comprising the steps of applying the underlayer film-forming composition defined above onto a substrate to form an underlayer film, forming a photoresist film on the underlayer film, forming a photoresist pattern via exposure and development, processing the underlayer film with the photoresist pattern serving as mask, and implanting ions into the substrate;

a process for forming a pattern in a substrate by lithography, comprising the steps of applying the underlayer film-forming composition defined above onto a substrate to form an underlayer film, forming a silicon-containing intermediate film on the underlayer film, forming a photoresist film on the intermediate film, forming a photoresist pattern via exposure and development, processing the intermediate film with the photoresist pattern serving as mask, processing the underlayer film with the intermediate film serving as mask, and processing the substrate with the underlayer film serving as mask;

a process for forming a pattern in a substrate by lithography, comprising the steps of applying the underlayer film-forming composition defined above onto a substrate to form an underlayer film, forming a silicon-containing intermediate film on the underlayer film, forming a photoresist film on the intermediate film, forming a photoresist pattern via exposure and development, processing the intermediate film with the photoresist pattern serving as mask, processing the underlayer film with the intermediate film serving as mask, and implanting ions into the substrate with the underlayer film serving as mask.

Preferably, the pattern forming process may further comprise the step of stripping the underlayer film in alkaline water before or after the step of processing the substrate.

Also preferably, the pattern forming process may further comprise the step of stripping the underlayer film in alkaline water after the ion implantation step.

More preferably the alkaline water is at pH 9 or higher. Typically the alkaline water contains 1 to 99% by weight of at least one member selected from among ammonia, ammonia hydrogen peroxide water, tetramethylammonium hydroxide, tetraethylammonium hydroxide, tetrapropylammonium hydroxide, tetrabutylammonium hydroxide, choline hydroxide, benzyltrimethylammonium hydroxide, benzyltriethylammonium hydroxide, DBU, DBN, hydroxylamine, 1-butyl-1-methylpyrrolidinium hydroxide, 1-propyl-1-methylpyrrolidinium hydroxide, 1-butyl-1-methylpiperidinium hydroxide, 1-propyl-1-methylpiperidinium hydroxide, mepiquathydroxide, trimethylsulfonium hydroxide, hydrazines, ethylenediamines, and guanidines.

Advantageous Effects of Invention

When a pattern is formed in a substrate by ion implantation, there is a need for an underlayer film which is strippable without causing damage to the ion implanted substrate. Ideal for the purpose of forming a satisfactory pattern even on an irregular substrate surface by lithography is the trilayer process involving coating a thick underlayer film to flatten the topography of the substrate, and coating a light-absorptive silicon-containing intermediate film thereon whereby the two-layer antireflection coating minimizes substrate reflection. However, after ions are implanted through the pattern formed by the trilayer process, it is difficult to strip the trilayer without causing damage to the ion implanted substrate. In contrast, the resist underlayer film-forming composition of the invention is strippable with alkaline water. A novolak resin comprising recurring units of a naphtholphthalein is hydrolyzed in alkaline water to generate carboxyl groups so that the resin turns soluble in alkaline aqueous solution. Thus the underlayer film can be stripped without causing damage to the ion implanted Si or $SiO_2$ substrate.

BRIEF DESCRIPTION OF DRAWINGS

FIG. 2 is a set of cross-sectional views illustrating later steps of the pattern forming process, (E) showing the steps of PEB and alkaline development, (F) showing the step of processing the hydrocarbon underlayer film with $H_2$ gas with the silicon-containing intermediate film made mask, (G) showing the step of ion implantation with the hydrocarbon underlayer film made mask, and (H) showing the substrate after the silicon-containing intermediate film and hydrocarbon underlayer film have been stripped off.

DESCRIPTION OF PREFERRED EMBODIMENTS

Figure 1A:
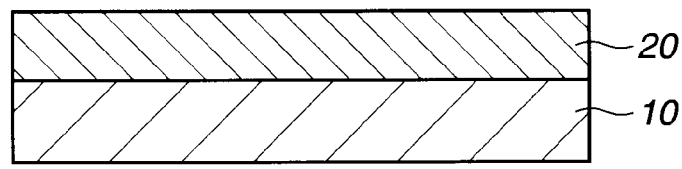
FIG. 1 is a set of cross-sectional views illustrating former steps of the pattern forming process according to one embodiment of the invention, (A) showing a hydrocarbon underlayer film formed on a substrate, (B) showing a silicon-containing intermediate film formed thereon, (C) showing a resist film formed thereon, and (D) showing exposure of the resist film.

In the disclosure, the singular forms "a," "an" and "the" include plural referents unless the context clearly dictates otherwise. The notation (Cn-Cm) means a group containing from n to m carbon atoms per group. As used herein, the term "underlayer" refers to a layer under the resist film.

The abbreviations and acronyms have the following meaning.

Mw: weight average molecular weight

Mn: number average molecular weight

Mw/Mn: molecular weight distribution or dispersity

GPC: gel permeation chromatography

PEB: post-exposure bake

BARC: bottom antireflective coating

PAG: photoacid generator

The inventors made efforts to develop a resist underlayer film-forming composition which can be stripped with alkaline water, especially ammonia hydrogen peroxide solution, after ion implantation. To this end, a material which is hydrolyzable with ammonia to generate a carboxyl or sulfo group so that its alkali dissolution rate is improved is preferred. Naphtholphthalein is a typical material. While lactones and acid anhydrides generate a carboxyl group upon hydrolysis, these materials are less resistant to dry etching. In order that a film be used as an underlayer film in the trilayer process or ion implantation process, the film must have an accordingly high level of dry etching resistance and ion implantation resistance. For such resistance, the material must have an aromatic group. Naphtholphthalein is excellent in dry etch resistance and effective for controlling reflection off substrate. Although it may be contemplated to use an underlayer film-forming material consisting of a naphtholphthalein monomer, the underlayer film composed of the monomer has a possibility that when a photoresist solution or a silicon-containing intermediate film solution is coated thereon, the underlayer film is dissolved in these solutions, with the risk of intermixing. To avoid the risk, a polymer containing naphtholphthalein must be used. Most advantageously, the polymer should take the form of a novolak resin resulting from polymerization with an aldehyde.

Based on the foregoing considerations, the inventors have found that a resist underlayer (antireflective) film-forming composition comprising a novolak resin comprising at least recurring units derived from a substituted or unsubstituted naphtholphthalein is advantageous in that the underlayer film formed therefrom has high dry etching resistance and ion implantation resistance and is strippable with alkaline water after dry etching or after ion implantation.

In one aspect, the invention is directed to a composition for forming a photoresist underlayer film for use in lithography, the underlayer film-forming composition comprising a novolak resin comprising recurring units of a substituted or unsubstituted naphtholphthalein. In a preferred embodiment, the novolak resin comprises recurring units having the general formula (1).

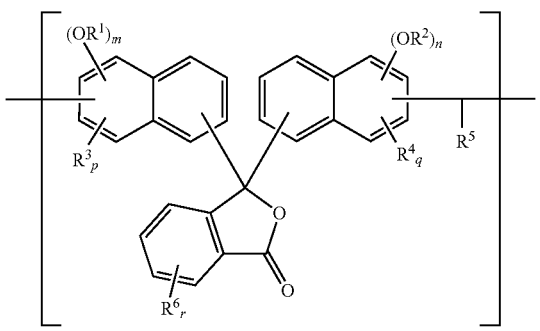

Herein $R^1$ and $R^2$ are independently hydrogen, an acid labile group, glycidyl group, or a straight, branched or cyclic $C_1$-$C_{10}$, especially $C_1$-$C_6$ alkyl, acyl or alkoxycarbonyl. $R^3$, $R^4$ and $R^6$ are independently hydrogen, or a straight, branched or cyclic $C_1$-$C_{10}$, especially $C_1$-$C_6$ alkyl group, $C_2$-$C_{10}$, especially $C_2$-$C_6$ alkenyl group, or $C_6$-$C_{10}$ aryl group, which may have a hydroxyl, alkoxy, acyloxy, ether or sulfide moiety, or a halogen atom, hydroxyl group or $C_1$-$C_4$ alkoxy group. $R^5$ is hydrogen, or a straight, branched or cyclic $C_1$-$C_6$ alkyl group, a straight, branched or cyclic $C_2$-$C_{10}$, especially $C_2$-$C_6$ alkenyl group, or $C_6$-$C_{12}$, especially $C_6$-$C_{10}$ aryl group, which may have a hydroxyl, alkoxy (especially $C_1$-$C_4$ alkoxy), ether, thioether, carboxyl, alkoxycarbonyl (especially $C_1$-$C_6$ alkoxycarbonyl), acyloxy, —COOR or —OR moiety, wherein R is a lactone ring, acid labile group, or —R'—COOR", wherein R' is a single bond or alkylene group, preferably $C_1$-$C_3$ alkylene, and R" is an acid labile group. The subscripts m, n, p, q and r each are 1 or 2.

It is noted that the alkenyl groups having an ether or thioether moiety are shown below.

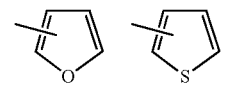

Examples of the monomer from which the novolak resin comprising recurring units of formula (1) is derived are illustrated below, but not limited thereto.

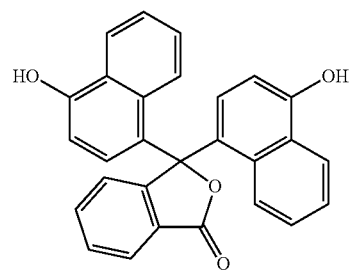

-continued
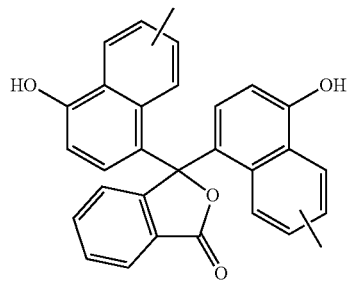
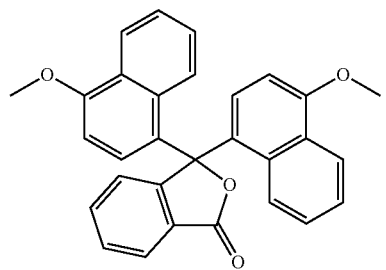
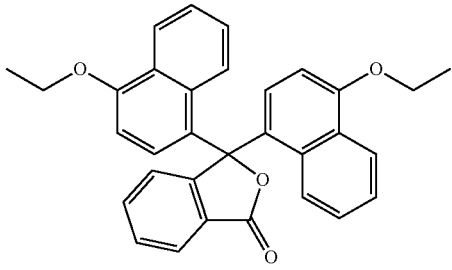
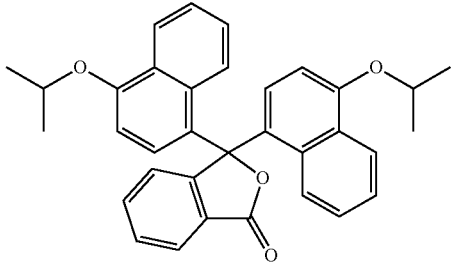
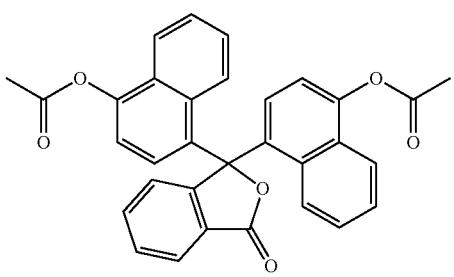
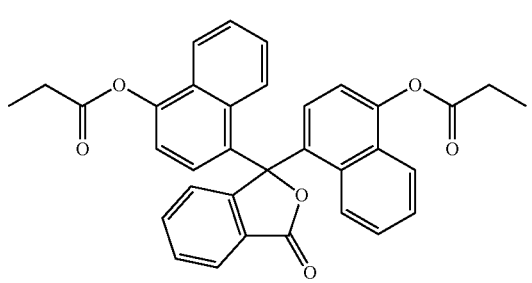
-continued
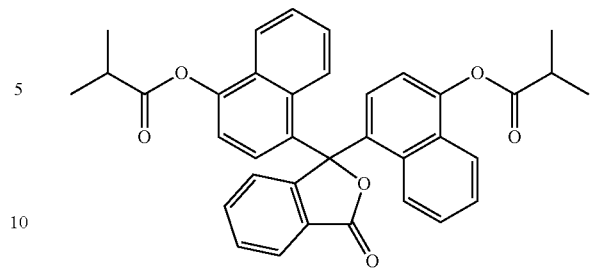
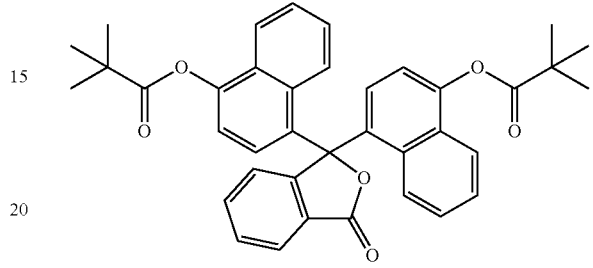
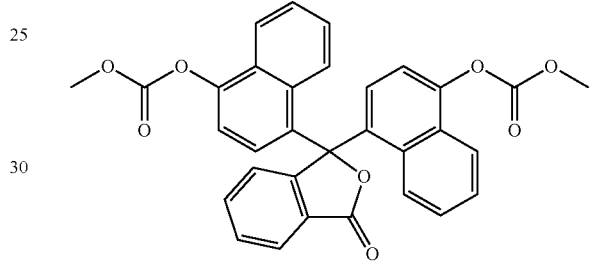
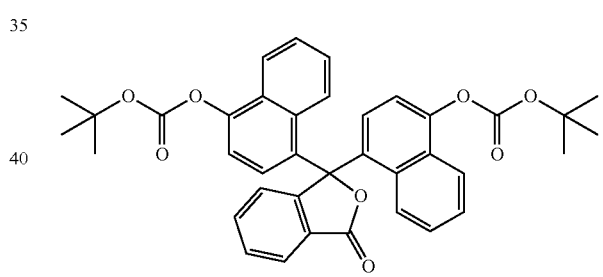
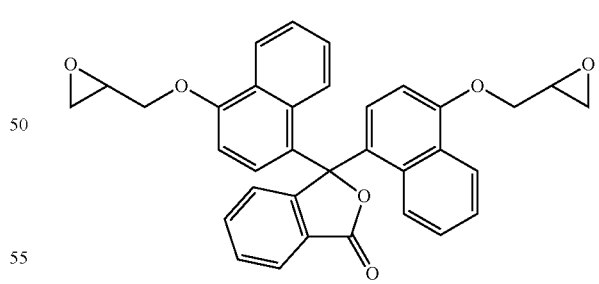
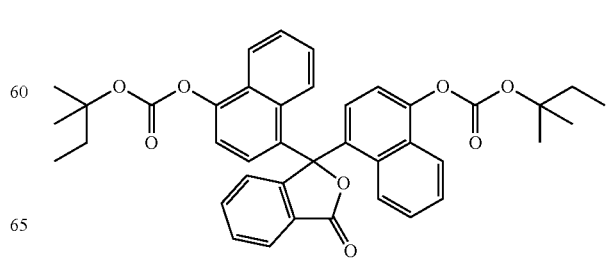

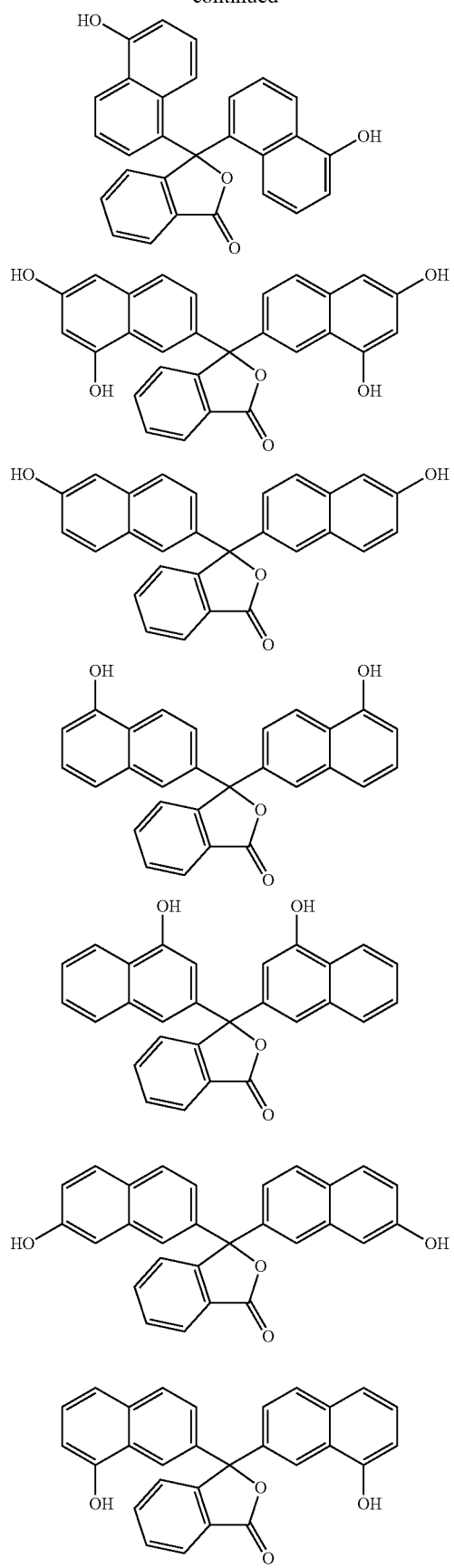

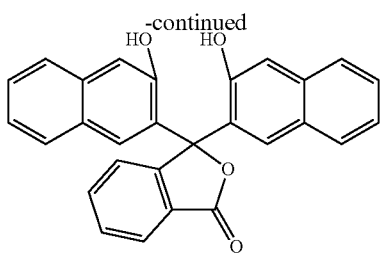

When novolak resins are derived from a substituted or unsubstituted naphtholphthalein, it may be co-condensed with another monomer or monomers. Examples of the co-condensable monomer include, but are not limited to, phenolphthalein, Phenol Red, Cresolphthalein, Cresol Red, Thymolphthalein, phenol, o-cresol, m-cresol, p-cresol, 2,3-dimethylphenol, 2,5-dimethylphenol, 3,4-dimethylphenol, 3,5-dimethylphenol, 2,4-dimethylphenol, 2,6-dimethylphenol, 2,3,5-trimethylphenol, 3,4,5-trimethylphenol, 2-tert-butylphenol, 3-tert-butylphenol, 4-tert-butylphenol, 2-phenylphenol, 3-phenylphenol, 4-phenylphenol, 3,5-diphenylphenol, 2-naphthylphenol, 3-naphthylphenol, 4-naphthylphenol, 4-tritylphenol, resorcinol, 2-methylresorcinol, 4-methylresorcinol, 5-methylresorcinol, catechol, 4-tert-butylcatechol, 2-methoxyphenol, 3-methoxyphenol, 2-propylphenol, 3-propylphenol, 4-propylphenol, 2-isopropylphenol, 3-isopropylphenol, 4-isopropylphenol, 2-methoxy-5-methylphenol, 2-tert-butyl-5-methylphenol, pyrogallol, thymol, isothymol, 4,4'-(9H-fluoren-9-ylidene)bisphenol, 2,2'-dimethyl-4,4'-(9H-fluoren-9-ylidene)bisphenol, 2,2'-diallyl-4,4'-(9H-fluoren-9-ylidene)bisphenol, 2,2'-difluoro-4,4'-(9H-fluoren-9-ylidene)bisphenol, 2,2'-diphenyl-4,4'-(9H-fluoren-9-ylidene)bisphenol, 2,2'-dimethoxy-4,4'-(9H-fluoren-9-ylidene)bisphenol, 2,3,2',3'-tetrahydro-(1,1')-spirobiindene-6,6'-diol, 3,3,3',3'-tetramethyl-2,3,2',3'-tetrahydro-(1,1')-spirobiindene-6,6'-diol, 3,3,3',3',4,4'-hexamethyl-2,3,2',3'-tetrahydro-(1,1')-spirobiindene-6,6'-diol, 2,3,2',3'-tetrahydro-(1,1')-spirobiindene-5,5'-diol, 5,5'-dimethyl-3,3,3',3'-tetramethyl-2,3,2',3'-tetrahydro-(1,1')-spirobiindene-6,6'-diol, 1,2-dihydroxynaphthalene, 1,3-dihydroxynaphthalene, 1,4-dihydroxynaphthalene, 1,5-dihydroxynaphthalene, 1,6-dihydroxynaphthalene, 1,7-dihydroxynaphthalene, 1,8-dihydroxynaphthalene, 2,3-dihydroxynaphthalene, 2,4-dihydroxynaphthalene, 2,5-dihydroxynaphthalene, 2,6-dihydroxynaphthalene, 2,7-dihydroxynaphthalene, and 2,8-dihydroxynaphthalene. Examples of the compound which can be co-condensed with dihydroxynaphthalene include 1-naphthol, 2-naphthol, 2-methyl-1-naphthol, 4-methoxy-1-naphthol, 7-methoxy-2-naphthol, 6-methoxy-2-naphthol, 3-methoxy-2-naphthol, 1,4-dimethoxynaphthalene, 1,5-dimethoxynaphthalene, 1,6-dimethoxynaphthalene, 1,7-dimethoxynaphthalene, 1,8-dimethoxynaphthalene, 2,3-dimethoxynaphthalene, 2,6-dimethoxynaphthalene, 2,7-dimethoxynaphthalene, methyl 3-hydroxy-naphthalene-2-carboxylate, naphthalene, 1-methylnaphthalene, 2-methylnaphthalene, 1,2-dimethylnaphthalene, 1,3-dimethylnaphthalene, 1,4-dimethylnaphthalene, 1,5-dimethylnaphthalene, 1,6-dimethylnaphthalene, 1,7-dimethylnaphthalene, 1,8-dimethylnaphthalene, 2,3-dimethylnaphthalene, 2,6-dimethylnaphthalene, 2,7-dimethylnaphthalene, 1-ethylnaphthalene, 2-ethylnaphthalene, 1-propylnaphthalene, 2-propylnaphthalene, 1-butylnaphthalene, 2-butylnaphthalene, 1-phenylnaphthalene, 1-cyclohexylnaphthalene, 1-cyclopentylnaphthalene, 1,1'-bi(2-naphthol), o-cresol, m-cresol, p-cresol, indene, hydroxyanthracene, acenaphthylene, acenaphthene, biphenyl, bisphenol, trisphenol, dicyclopentadiene, 1,5-dimethylnaphthalene, and 6,6'-(9H-fluoren-9-ylidene)bis-2-naphthol.

The monomer to be co-condensed may be contained in an amount of 0 to 80 mol %.

Upon polymerization of a substituted or unsubstituted naphtholphthalein, aldehydes are added thereto to form novolak resins. Novolak conversion brings about a molecular weight buildup, thus controlling outgassing or particle formation from a low molecular weight fraction during bake. Examples of the aldehyde used herein include formaldehyde, trioxane, paraformaldehyde, benzaldehyde, methoxybenzaldehyde, phenylbenzaldehyde, tritylbenzaldehyde, cyclohexylbenzaldehyde, cyclopentylbenzaldehyde, tert-butylbenzaldehyde, naphthalene aldehyde, hydroxynaphthalene aldehyde, anthracene aldehyde, fluorene aldehyde, pyrene aldehyde, methoxynaphthalene aldehyde, dimethoxynaphthalene aldehyde, acetaldehyde, propyl aldehyde, phenylacetaldehyde, naphthalene acetaldehyde, substituted or unsubstituted carboxynaphthalene acetaldehyde, α-phenylpropyl aldehyde, β-phenylpropyl aldehyde, o-hydroxybenzaldehyde, m-hydroxybenzaldehyde, p-hydroxybenzaldehyde, o-chlorobenzaldehyde, m-chlorobenzaldehyde, p-chlorobenzaldehyde, o-nitrobenzaldehyde, m-nitrobenzaldehyde, p-nitrobenzaldehyde, o-methylbenzaldehyde, m-methylbenzaldehyde, p-methylbenzaldehyde, p-ethylbenzaldehyde, p-n-butylbenzaldehyde, furfural, furancarboxyaldehyde, and thiophene aldehyde. Inter alia, formaldehyde is most preferred. These aldehydes may be used alone or in combination of two or more.

An appropriate amount of the aldehyde used is 0.2 to 5 moles, more preferably 0.5 to 2 moles per mole of the naphtholphthalein.

A catalyst may be used in the condensation reaction of naphtholphthalein with an aldehyde(s). Suitable catalysts are acidic catalysts such as hydrochloric acid, nitric acid, sulfuric acid, formic acid, oxalic acid, acetic acid, methanesulfonic acid, camphorsulfonic acid, tosylic acid, and trifluoromethanesulfonic acid. An appropriate amount of the acidic catalyst used is $1 \times 10^{-5}$ to $5 \times 10^{-1}$ mole per mole of the naphtholphthalein.

The novolak resin comprising recurring units of naphtholphthalein should preferably have a weight average molecular weight (Mw) of 400 to 20,000, as measured by GPC versus polystyrene standards. Mw is more preferably in a range of 500 to 10,000, even more preferably 600 to 10,000. Since a resin having a lower molecular weight has better burying properties, but is more likely to outgassing during bake, the Mw is preferably optimized for a balance of burying and outgassing. One measure for meeting both burying ability and outgassing reduction is to cut off unpolymerized naphtholphthalein as much as possible and preferably to minimize the amount of a low molecular weight fraction including dimer and trimer.

In formulating the hydrocarbon underlayer film-forming composition, the novolak resin comprising recurring units of naphtholphthalein may be blended with another resin. Suitable resins which can be blended are novolak resins obtained from reaction of phenols or analogs with aldehydes, with suitable phenols and analogs including phenolphthalein, Phenol Red, Cresolphthalein, Cresol Red, Thymolphthalein, phenol, o-cresol, m-cresol, p-cresol, 2,3-dimethylphenol, 2,5-dimethylphenol, 3,4-dimethylphenol, 3,5-dimethylphenol, 2,4-dimethylphenol, 2,6-dimethylphenol, 2,3,5-trimethylphenol, 3,4,5-trimethylphenol, 2-tert-butylphenol, 3-tert-butylphenol, 4-tert-butylphenol, 2-phenylphenol, 3-phenylphenol, 4-phenylphenol, 3,5-diphenylphenol, 2-naphthylphenol, 3-naphthylphenol, 4-naphthylphenol, 4-tritylphenol, resorcinol, 2-methylresorcinol, 4-methylresorcinol, 5-methylresorcinol, catechol, 4-tert-butylcatechol, 2-methoxyphenol, 3-methoxyphenol, 2-propylphenol, 3-propylphenol, 4-propylphenol, 2-isopropylphenol, 3-isopropylphenol, 4-isopropylphenol, 2-methoxy-5-methylphenol, 2-tert-butyl-5-methylphenol, pyrogallol, thymol, isothymol, 1-naphthol, 2-naphthol, 2-methyl-1-naphthol, 4-methoxy-1-naphthol, 7-methoxy-2-naphthol, dihydroxynaphthalenes (e.g., 1,5-dihydroxynaphthalene, 1,7-dihydroxynaphthalene, 2,6-dihydroxynaphthalene), methyl 3-hydroxy-naphthalene-2-carboxylate, indene, hydroxyindene, benzofuran, hydroxyanthracene, acenaphthylene, biphenyl, bisphenol, and trisphenol. Also useful are resins obtained from copolymerization of a phenol with dicyclopentadiene, tetrahydroindene, 4-vinylcyclohexene, norbornadiene, 5-vinylnorborn-2-ene, α-pinene, β-pinene or limonene, but without aldehydes.

The underlayer film-forming composition may further comprise a polymer obtained from polymerization of a monomer selected from among hydroxystyrene, alkoxystyrenes, hydroxyvinylnaphthalene, alkoxyvinylnaphthalenes, (meth)acrylates, vinyl ethers, maleic anhydride, and itaconic anhydride. It is also acceptable to add a monomer form of naphtholphthalein, phenolphthalein, Phenol Red, Cresolphthalein, Cresol Red or Thymolphthalein to the composition.

While various high-carbon resins may be added to the underlayer film-forming composition, exemplary high-carbon resins are described in the following patents.

JP-A 2004-205658, JP-A 2004-205676, JP-A 2004-205685,

JP-A 2004-271838, JP-A 2004-354554, JP-A 2005-010431,

JP-A 2005-049810, JP-A 2005-114921, JP-A 2005-128509,

JP-A 2005-250434, JP-A 2006-053543, JP-A 2006-227391,

JP-A 2006-259249, JP-A 2006-259482, JP-A 2006-285095,

JP-A 2006-293207, JP-A 2006-293298, JP-A 2007-140461,

JP-A 2007-171895, JP-A 2007-199653, JP-A 2007-316282,

JP-A 2008-026600, JP-A 2008-065303, JP-A 2008-096684,

JP-A 2008-116677, JP-A 2008-145539, JP-A 2008-257188,

JP-A 2010-160189, JP-A 2010-134437, JP-A 2010-170013, and JP-A 2010-271654.

The amount of the other resin may be 0 to 300 parts by weight.

While $R^1$, $R^2$, R, and R" stand for an acid labile group, the acid labile groups may be identical or different and preferably include groups of the following formulae (A-1) to (A-3).

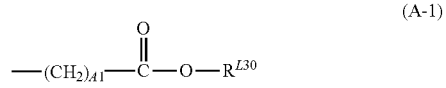

(A-1)

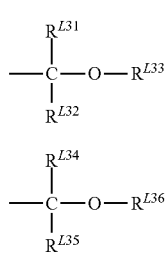

(A-2)

(A-3)

In formula (A-1), $R^{L30}$ is a tertiary alkyl group of 4 to 20 carbon atoms, preferably 4 to 15 carbon atoms, a trialkylsilyl group in which each alkyl moiety has 1 to 6 carbon atoms, an oxoalkyl group of 4 to 20 carbon atoms, or a group of formula (A-3). Exemplary tertiary alkyl groups are tert-butyl, tert-amyl, 1,1-diethylpropyl, 1-ethylcyclopentyl, 1-butylcyclopentyl, 1-ethylcyclohexyl, 1-butylcyclohexyl, 1-ethyl-2-cyclopentenyl, 1-ethyl-2-cyclohexenyl, and 2-methyl-2-adamantyl. Exemplary trialkylsilyl groups are trimethylsilyl, triethylsilyl, and dimethyl-tert-butylsilyl. Exemplary oxoalkyl groups are 3-oxocyclohexyl, 4-methyl-2-oxooxan-4-yl, and 5-methyl-2-oxooxolan-5-yl. Letter A1 is an integer of 0 to 6.

In formula (A-2), $R^{L31}$ and $R^{L32}$ each are hydrogen or a straight, branched or cyclic alkyl group of 1 to 18 carbon atoms, preferably 1 to 10 carbon atoms. Exemplary alkyl groups include methyl, ethyl, propyl, isopropyl, n-butyl, sec-butyl, tert-butyl, cyclopentyl, cyclohexyl, 2-ethylhexyl, and n-octyl. $R^{L33}$ is a monovalent hydrocarbon group of 1 to 18 carbon atoms, preferably 1 to 10 carbon atoms, which may contain a heteroatom such as oxygen, examples of which include straight, branched or cyclic alkyl groups and substituted forms of such alkyl groups in which some hydrogen atoms are replaced by hydroxyl, alkoxy, oxo, amino, alkylamino or the like. Illustrative examples of the substituted alkyl groups are shown below.

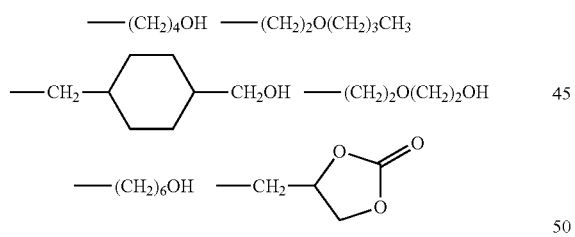

A pair of $R^{L31}$ and $R^{L32}$, $R^{L31}$ and $R^{L33}$, or $R^{L32}$ and $R^{L33}$ may bond together to form a ring with the carbon and oxygen atoms to which they are attached. Each of $R^{L31}$, $R^{L32}$ and $R^{L33}$ is a straight or branched alkylene group of 1 to 18 carbon atoms, preferably 1 to 10 carbon atoms when they form a ring, while the ring preferably has 3 to 10 carbon atoms, more preferably 4 to 10 carbon atoms.

Examples of the acid labile groups of formula (A-1) include tert-butoxycarbonyl, tert-butoxycarbonylmethyl, tert-amyloxycarbonyl, tert-amyloxycarbonylmethyl, 1,1-diethylpropyloxycarbonyl, 1,1-diethylpropyloxycarbonylmethyl, 1-ethyl cyclopentyloxycarbonyl, 1-ethylcyclopentyloxycarbonylmethyl, 1-ethyl-2-cyclopentenyloxycarbonyl, 1-ethyl-2-cyclopentenyloxycarbonylmethyl, 1-ethoxyethoxycarbonylmethyl, 2-tetrahydropyranyloxycarbonylmethyl, and 2-tetrahydrofuranyloxycarbonylmethyl groups.

Also included are substituent groups having the formulae (A-1)-1 to (A-1)-10.

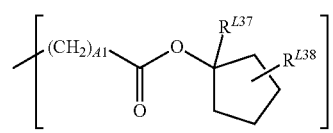
(A-1)-1

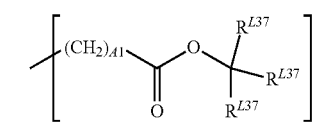
(A-1)-2

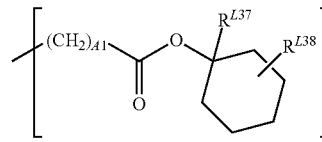
(A-1)-3

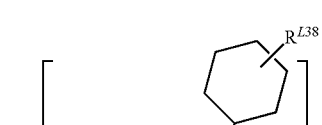
(A-1)-4

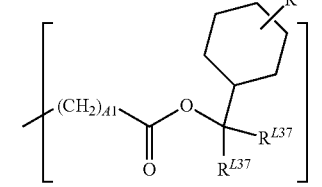
(A-1)-5

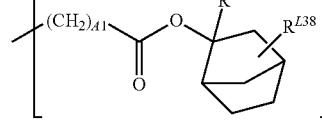
(A-1)-6

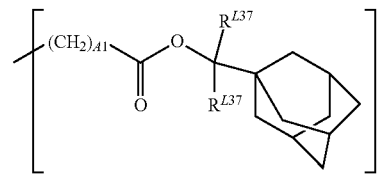
(A-1)-7

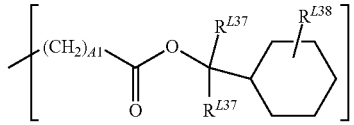
(A-1)-8

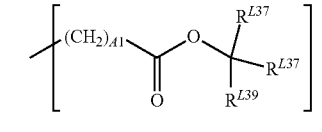
(A-1)-9

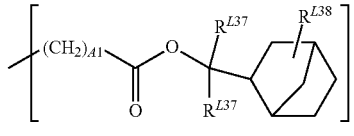
(A-1)-10

Herein $R^{L37}$ is each independently a straight, branched or cyclic $C_1$-$C_{10}$ alkyl group or $C_6$-$C_{20}$ aryl group. $R^{L38}$ is hydrogen or a straight, branched or cyclic $C_1$-$C_{10}$ alkyl group. $R^{L39}$ is each independently a straight, branched or cyclic $C_2$-$C_{10}$ alkyl group or $C_6$-$C_{20}$ aryl group. A1 is an integer of 0 to 6.

Of the acid labile groups of formula (A-2), the straight and branched ones are exemplified by the following groups having formulae (A-2)-1 to (A-2)-69.

$$—CH_2—O—CH_3 \quad (A\text{-}2)\text{-}1$$

$$—CH_2—O—CH_2—CH_3 \quad (A\text{-}2)\text{-}2$$

$$—CH_2—O—(CH_2)_2—CH_3 \quad (A\text{-}2)\text{-}3$$

$$—CH_2—O—(CH_2)_3—CH_3 \quad (A\text{-}2)\text{-}4$$

(A-2)-5

$$—CH_2—O—\underset{CH_3}{\underset{|}{CH}}—CH_3$$

(A-2)-6

$$—CH_2—O—\underset{CH_3}{\overset{CH_3}{\underset{|}{\overset{|}{C}}}}—CH_3$$

(A-2)-7

$$—\underset{CH_3}{\underset{|}{CH}}—O—CH_3$$

(A-2)-8

$$—\underset{\underset{CH_3}{|}}{\overset{CH_3}{\underset{|}{CH_2}}}\atop{\underset{|}{CH}}—O—CH_3$$

(A-2)-9

$$—\underset{\underset{CH_3}{|}}{\overset{CH_3}{\underset{|}{(CH_2)_2}}}\atop{\underset{|}{CH}}—O—CH_3$$

(A-2)-10

$$—\underset{CH_3}{\underset{|}{CH}}—O—CH_2—CH_3$$

(A-2)-11

$$—\underset{\underset{CH_3}{|}}{\overset{CH_3}{\underset{|}{CH_2}}}\atop{\underset{|}{CH}}—O—CH_2—CH_3$$

(A-2)-12

$$—\underset{\underset{CH_3}{|}}{\overset{CH_3}{\underset{|}{(CH_2)_2}}}\atop{\underset{|}{CH}}—O—CH_2—CH_3$$

(A-2)-13

$$—\underset{CH_3}{\underset{|}{CH}}—O—(CH_2)_2—CH_3$$

(A-2)-14

$$—\underset{\underset{CH_3}{|}}{\overset{CH_3}{\underset{|}{CH_2}}}\atop{\underset{|}{CH}}—O—(CH_2)_2—CH_3$$

(A-2)-15

$$—\underset{\underset{CH_3}{|}}{\overset{CH_3}{\underset{|}{(CH_2)_2}}}\atop{\underset{|}{CH}}—O—(CH_2)_2—CH_3$$

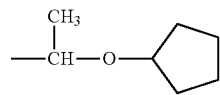
(A-2)-16

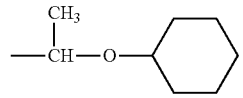
(A-2)-17

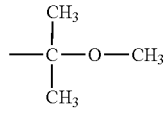
(A-2)-18

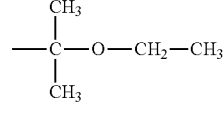
(A-2)-19

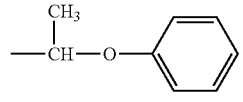
(A-2)-20

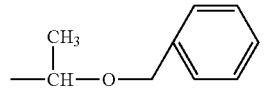
(A-2)-21

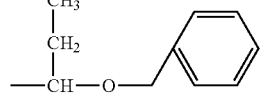
(A-2)-22

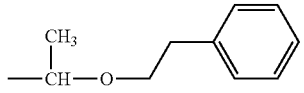
(A-2)-23

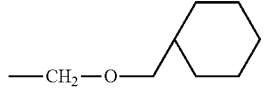
(A-2)-24

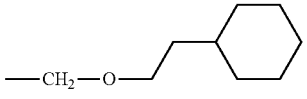
(A-2)-25

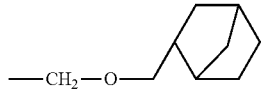
(A-2)-26

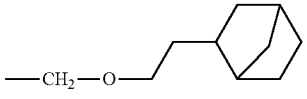
(A-2)-27

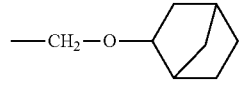
(A-2)-28

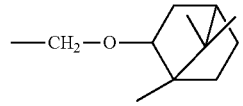
(A-2)-29

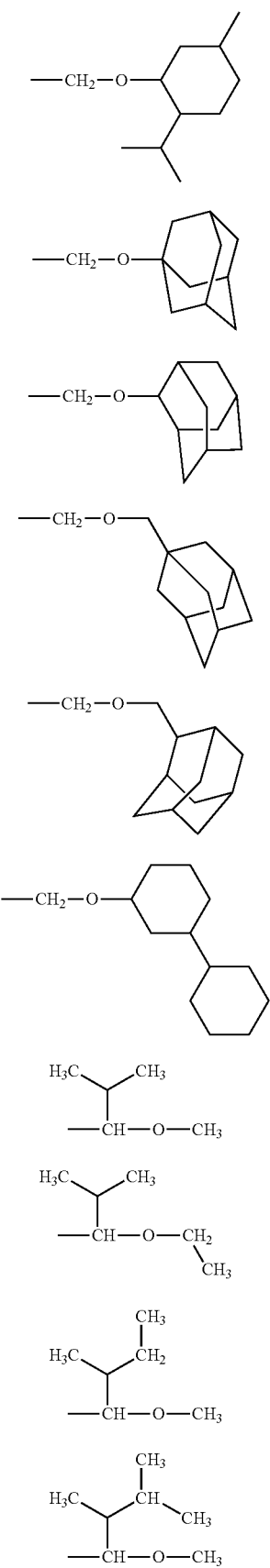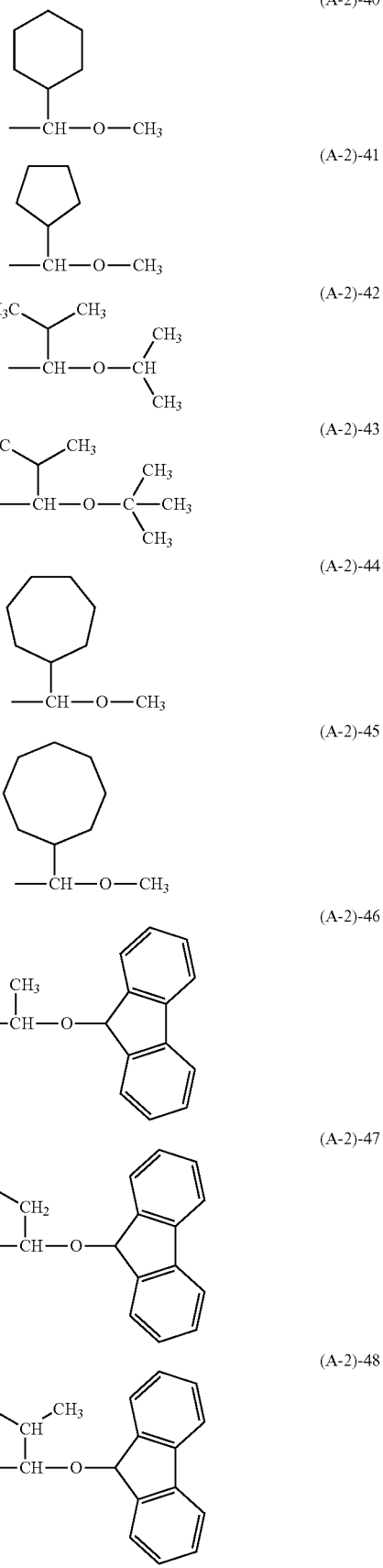

(A-2)-49
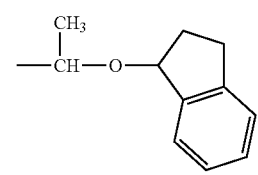
(A-2)-50
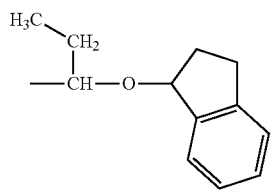
(A-2)-51
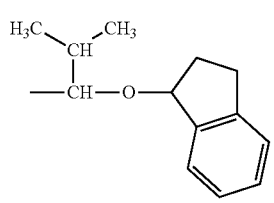
(A-2)-52
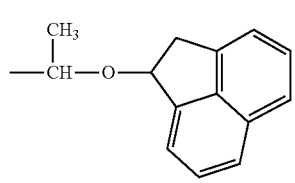
(A-2)-53
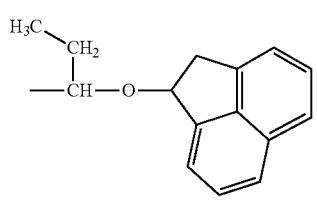
(A-2)-54
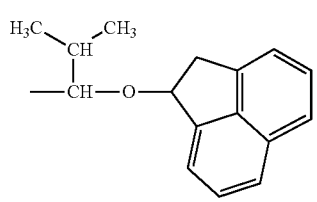
(A-2)-55
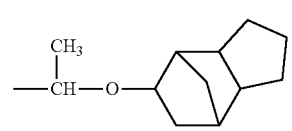
(A-2)-56
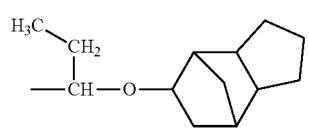
(A-2)-57
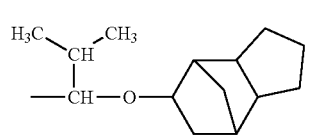
(A-2)-58
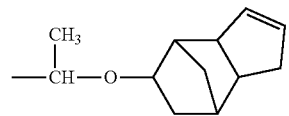
(A-2)59
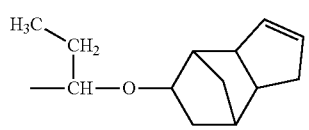
(A-2)-60
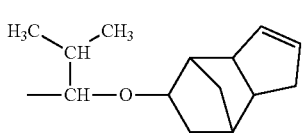
(A-2)-61
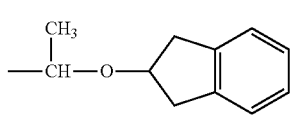
(A-2)-62
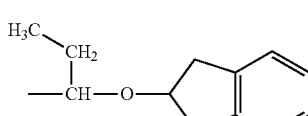
(A-2)-63
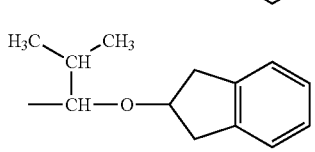
(A-2)-64
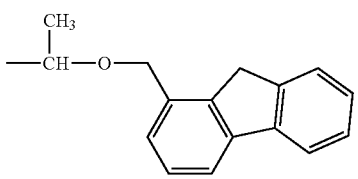
(A-2)-65
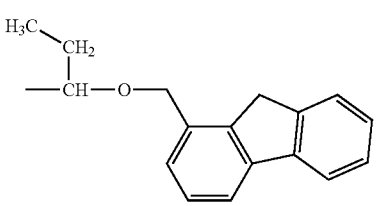
(A-2)-66
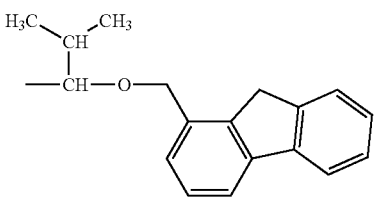
(A-2)-67
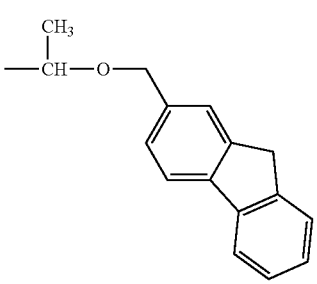

-continued

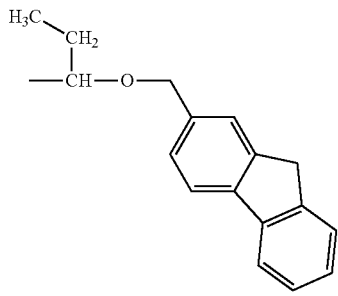
(A-2)-68

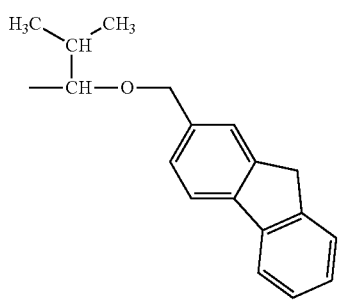
(A-2)-69

Of the acid labile groups of formula (A-2), the cyclic ones are, for example, tetrahydrofuran-2-yl, 2-methyltetrahydrofuran-2-yl, tetrahydropyran-2-yl, and 2-methyltetrahydropyran-2-yl.

Other examples of acid labile groups include those of the following formula (A-2a) or (A-2b) while the polymer (base resin) may be crosslinked within the molecule or between molecules with these acid labile groups.

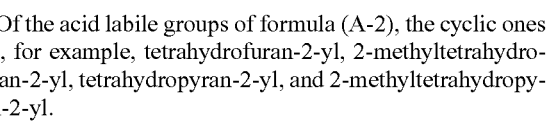
(A-2a)

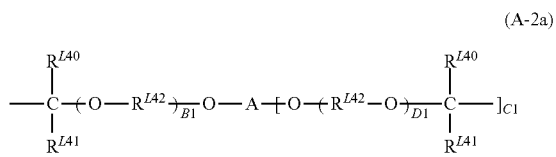
(A-2b)

Herein $R^{L40}$ and $R^{L41}$ each are hydrogen or a straight, branched or cyclic $C_1$-$C_8$ alkyl group, or $R^{L40}$ and $R^{L41}$, taken together, may form a ring with the carbon atom to which they are attached, and $R^{L40}$ and $R^{L41}$ are straight or branched $C_1$-$C_8$ alkylene groups when they form a ring. $R^{L42}$ is a straight, branched or cyclic $C_1$-$C_{10}$ alkylene group. Each of B1 and D1 is 0 or an integer of 1 to 10, preferably 0 or an integer of 1 to 5, and C1 is an integer of 1 to 7. "A" is a (C1+1)-valent aliphatic or alicyclic saturated hydrocarbon group, aromatic hydrocarbon group or heterocyclic group having 1 to 50 carbon atoms, which may be separated by a heteroatom or in which some hydrogen atoms attached to carbon atoms may be substituted by hydroxyl, carboxyl, carbonyl groups or fluorine atoms. "B" is —CO—O—, —NHCO—O— or —NHCONH—.

Preferably, "A" is selected from divalent to tetravalent, straight, branched or cyclic $C_1$-$C_{20}$ alkylene, alkyltriyl and alkyltetrayl groups, and $C_6$-$C_{30}$ arylene groups, which may contain a heteroatom or in which some hydrogen atoms attached to carbon atoms may be substituted by hydroxyl, carboxyl, acyl groups or halogen atoms. The subscript C1 is preferably an integer of 1 to 3.

The crosslinking acetal groups of formulae (A-2a) and (A-2b) are exemplified by the following formulae (A-2)-70 through (A-2)-77.

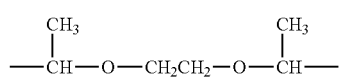
(A-2)-70

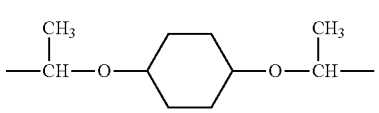
(A-2)-71

(A-2)-72

(A-2)-73

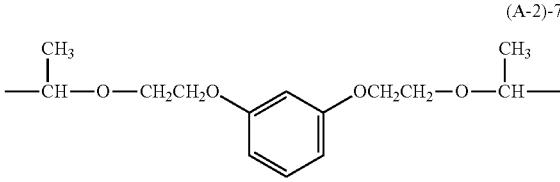
(A-2)-74

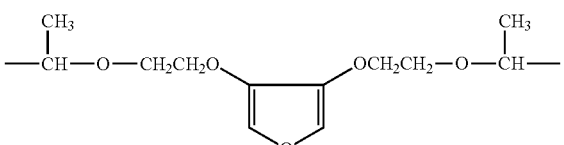
(A-2)-75

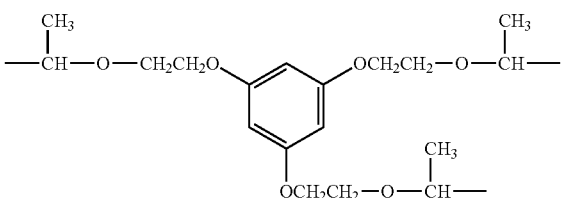
(A-2)-76

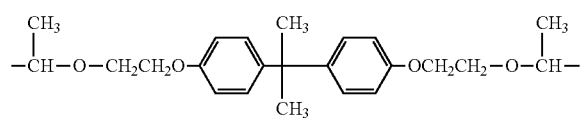
(A-2)-77

In formula (A-3), $R^{L34}$, $R^{L35}$ and $R^{L36}$ each are a monovalent hydrocarbon group, typically a straight, branched or cyclic $C_1$-$C_{20}$ alkyl group or a straight, branched or cyclic $C_2$-$C_{20}$ alkenyl group, which may contain a heteroatom such as oxygen, sulfur, nitrogen or fluorine. A pair of $R^{L34}$ and $R^{L35}$, $R^{L34}$ and $R^{L36}$, or $R^{L35}$ and $R^{L36}$ may bond together to form a $C_3$-$C_{20}$ ring with the carbon atom to which they are attached.

Exemplary tertiary alkyl groups of formula (A-3) include tert-butyl, triethylcarbyl, 1-ethylnorbornyl, 1-methylcyclohexyl, 1-ethylcyclopentyl, 2-(2-methyl)adamantyl, 2-(2-ethyl)adamantyl, and tert-amyl.

Other exemplary tertiary alkyl groups include those of the following formulae (A-3)-1 to (A-3)-18.
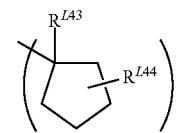 (A-3)-1
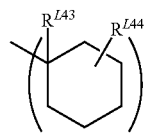 (A-3)-2
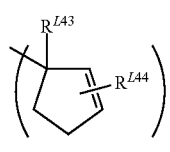 (A-3)-3
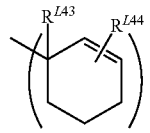 (A-3)-4
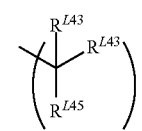 (A-3)-5
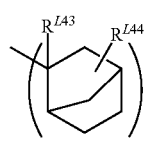 (A-3)-6
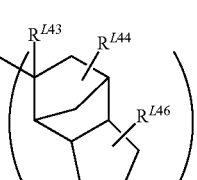 (A-3)-7
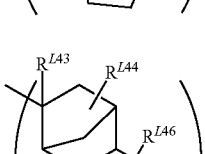 (A-3)-8
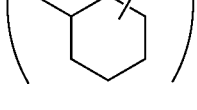 (A-3)-9
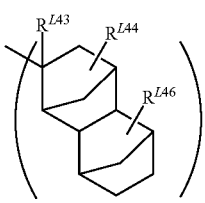 
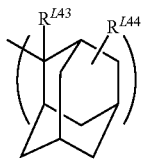 (A-3)-10
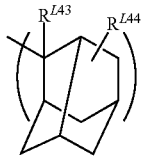 (A-3)-11
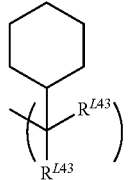 (A-3)-12
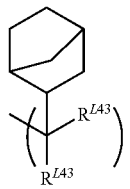 (A-3)-13
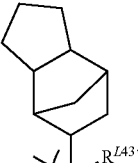 (A-3)-14
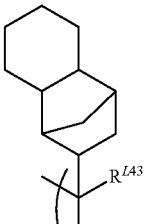 (A-3)-15
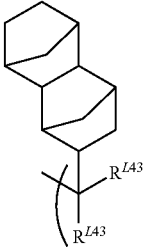 (A-3)-16

-continued

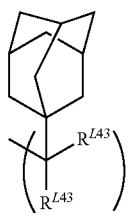

(A-3)-17

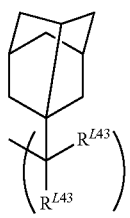

(A-3)-18

Herein $R^{L43}$ is each independently a straight, branched or cyclic $C_1$-$C_8$ alkyl group or $C_6$-$C_{20}$ aryl group, typically phenyl. $R^{L44}$ and $R^{L46}$ each are hydrogen or a straight, branched or cyclic $C_1$-$C_{20}$ alkyl group. $R^{L45}$ is a $C_6$-$C_{20}$ aryl group, typically phenyl.

The polymer may be crosslinked within the molecule or between molecules with groups having $R^{L47}$ which is a di- or multi-valent alkylene or arylene group, as shown by the following formulae (A-3)-19 and (A-3)-20.

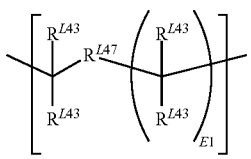

(A-3)-19

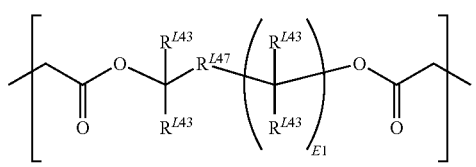

(A-3)-20

Herein $R^{L43}$ is as defined above. $R^{L47}$ is a straight, branched or cyclic $C_1$-$C_{20}$ alkylene group or arylene group, typically phenylene, which may contain a heteroatom such as oxygen, sulfur or nitrogen. E1 is an integer of 1 to 3.

The novolak resin comprising recurring units of formula (1) is adapted to generate a carboxyl group in a basic aqueous solution, typically ammonia hydrogen peroxide solution. Then the resin turns alkali soluble so that the film may be stripped with ammonia hydrogen peroxide solution.

The resist underlayer film must have the nature that when a silicon-containing intermediate film solution or resist solution is dispensed on the underlayer film, the underlayer film is neither dissolved in such solution nor mixed with such solution. To this end, the underlayer film must be crosslinked during post-application bake. In this regard, the underlayer film-forming composition should preferably further comprise a crosslinker.

Examples of the crosslinker which can be used herein include melamine compounds, guanamine compounds, glycoluril compounds and urea compounds having substituted thereon at least one group selected from among methylol, alkoxymethyl and acyloxymethyl groups, epoxy compounds, isocyanate compounds, azide compounds, and compounds having a double bond such as an alkenyl ether group. These compounds may be used as an additive or introduced as pendant groups on polymer side chains. Compounds having a hydroxy group are also useful as the crosslinker.

Of the foregoing crosslinkers, examples of suitable epoxy compounds include tris(2,3-epoxypropyl)isocyanurate, trimethylolmethane triglycidyl ether, trimethylolpropane triglycidyl ether, and triethylolethane triglycidyl ether. Examples of the melamine compound include hexamethylol melamine, hexamethoxymethyl melamine, hexamethylol melamine compounds having 1 to 6 methylol groups methoxymethylated and mixtures thereof, hexamethoxyethyl melamine, hexaacyloxymethyl melamine, hexamethylol melamine compounds having 1 to 6 methylol groups acyloxymethylated and mixtures thereof. Examples of the guanamine compound include tetramethylol guanamine, tetramethoxymethyl guanamine, tetramethylol guanamine compounds having 1 to 4 methylol groups methoxymethylated and mixtures thereof, tetramethoxyethyl guanamine, tetraacyloxyguanamine, tetramethylol guanamine compounds having 1 to 4 methylol groups acyloxymethylated and mixtures thereof. Examples of the glycoluril compound include tetramethylol glycoluril, tetramethoxyglycoluril, tetramethoxymethyl glycoluril, tetramethylol glycoluril compounds having 1 to 4 methylol groups methoxymethylated and mixtures thereof, tetramethylol glycoluril compounds having 1 to 4 methylol groups acyloxymethylated and mixtures thereof. Examples of the urea compound include tetramethylol urea, tetramethoxymethyl urea, tetramethylol urea compounds having 1 to 4 methylol groups methoxymethylated and mixtures thereof, and tetramethoxyethyl urea.

Examples of the isocyanate compound include tolylene diisocyanate, diphenylmethane diisocyanate, hexamethylene diisocyanate, and cyclohexane diisocyanate. Examples of the azide compound include 1,1'-biphenyl-4,4'-bisazide, 4,4'-methylidene bisazide and 4,4'-oxybisazide.

Suitable crosslinkers capable of crosslinking with an acetal group include compounds having a plurality of enol ether groups in the molecule. Suitable crosslinkers having two or more enol ether groups in the molecule include ethylene glycol divinyl ether, triethylene glycol divinyl ether, 1,2-propanediol divinyl ether, 1,4-butanediol divinyl ether, tetramethylene glycol divinyl ether, neopentyl glycol divinyl ether, trimethylol propane trivinyl ether, hexanediol divinyl ether, 1,4-cyclohexanediol divinyl ether, pentaerythritol trivinyl ether, pentaerythritol tetravinyl ether, sorbitol tetravinyl ether, sorbitol pentavinyl ether, trimethylol propane trivinyl ether, ethylene glycol dipropenyl ether, triethylene glycol dipropenyl ether, 1,2-propanediol dipropenyl ether, 1,4-butanediol dipropenyl ether, tetramethylene glycol dipropenyl ether, neopentyl glycol dipropenyl ether, trimethylol propane tripropenyl ether, hexanediol dipropenyl ether, 1,4-cyclohexanediol dipropenyl ether, pentaerythritol tripropenyl ether, pentaerythritol tetrapropenyl ether, sorbitol tetrapropenyl ether, sorbitol pentapropenyl ether, trimethylolpropane tripropenyl ether, and those described in JP-A H06-230574, JP-A 2007-536389, and JP-A 2008-501985.

Also useful are crosslinkers as shown below.
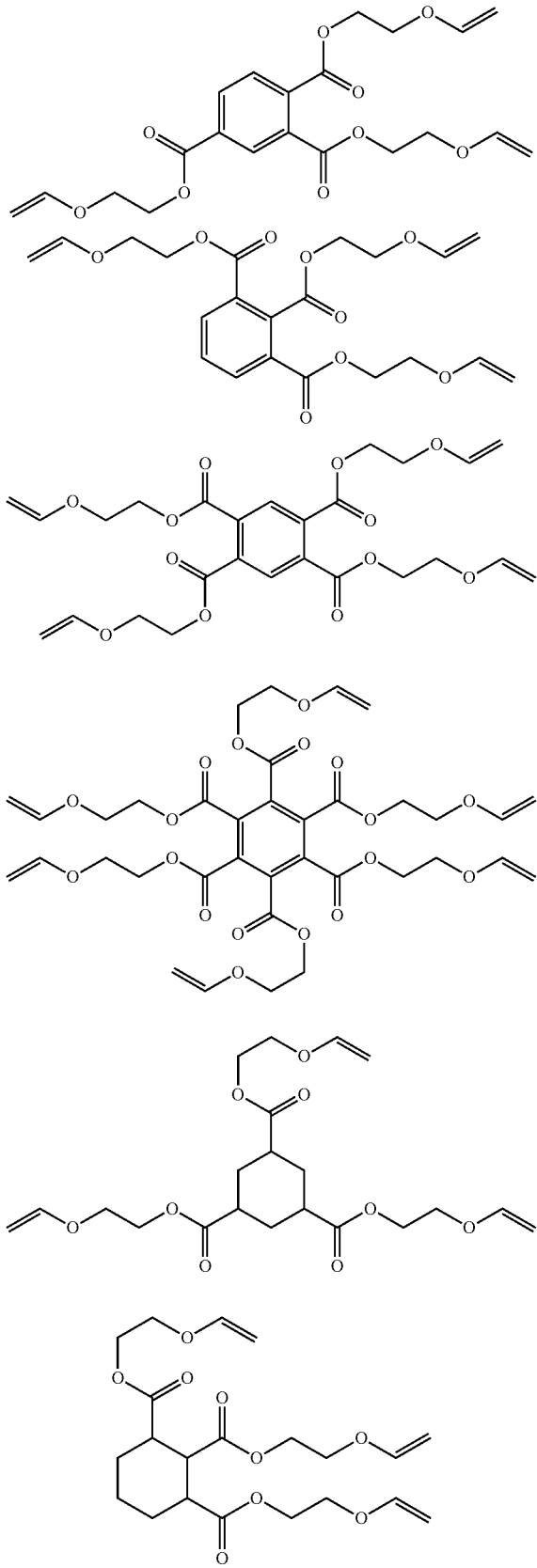
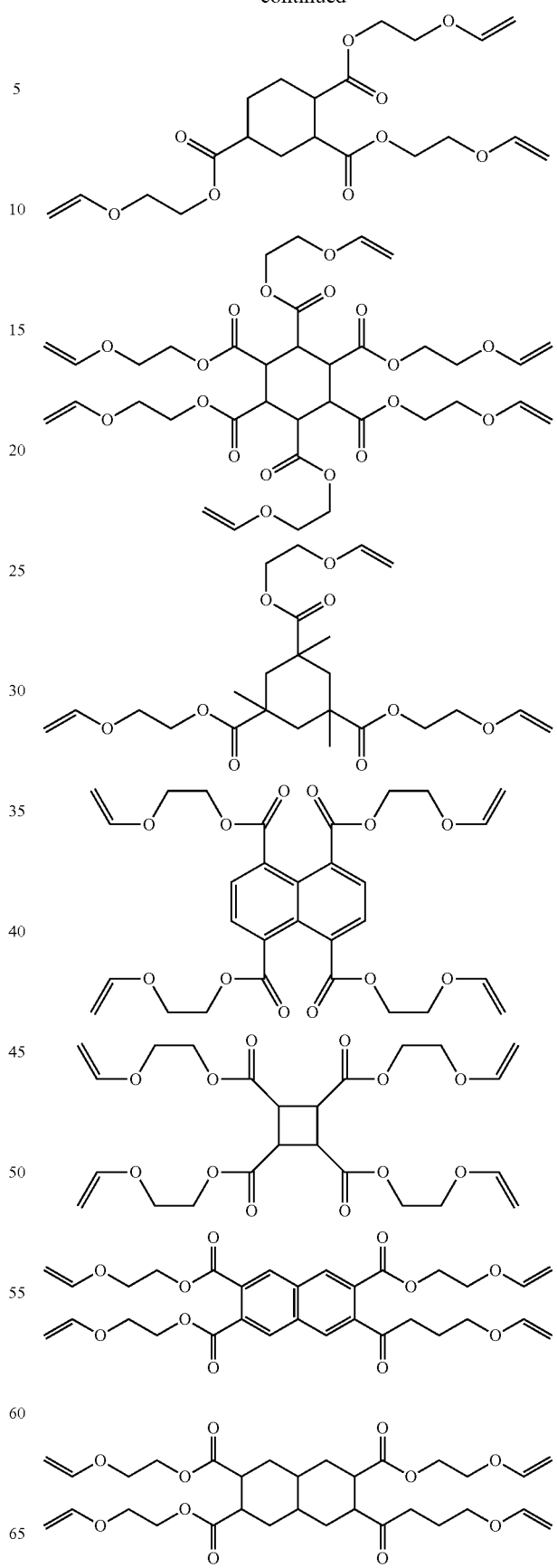

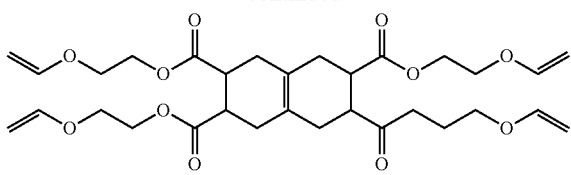

Upon application of heat, the enol ether group forms an acetal bond with a hydroxyl group. Therefore, when a compound having a plurality of enol ether groups per molecule is added, thermal crosslinking takes place via acetal groups.

Also useful is a crosslinker having an acid labile tertiary ester group and containing at least two oxirane rings in the molecule. Such crosslinkers are described in JP-A 2006-096848. The oxirane ring forms a crosslink by heat and the tertiary ester group is decomposed with acid. JP-A 2001-226430 discloses the thermal crosslinking of oxirane ring and the acid-aided decomposition mechanism.

In the hydrocarbon-based underlayer film-forming composition of the invention, the crosslinker is preferably compounded in an amount of 0 to 50 parts, more preferably 5 to 50 parts, and even more preferably 10 to 40 parts by weight per 100 parts by weight of the base polymer (total resins). Less than 5 parts of the crosslinker may leave the risk of intermixing with the resist film whereas more than 50 parts of the crosslinker may adversely affect the antireflection effect and permit the crosslinked film to crack.

On the underlayer film formed of the composition mentioned above, a photoresist film is formed in one embodiment. In another embodiment corresponding to the trilayer process, a photoresist film is formed on the underlayer film and an intermediate layer is formed between the photoresist film and the underlayer film. The trilayer process is preferred. The intermediate layer contains a metal selected from silicon, titanium, zirconium, hafnium and the like. Of these, silicon is the most preferred element in the intermediate layer.

Where the trilayer process is applied to the pattern formation technology by ion implantation, not only stripping of the underlayer film, but also stripping of the intermediate layer after ion implantation are considerations. Where a SOG film is used as the intermediate layer, fluorocarbon based gas is used to strip the SOG film by dry process, but the etching with fluorocarbon based gas can cause damage to the underlying oxide film. The SOG film may also be stripped using an aqueous solution of hydrofluoric acid, but the underlying oxide film is simultaneously stripped with this solution. It is thus necessary to strip the intermediate layer and underlayer film using an acid or alkali or a solvent. The intermediate layer which can be stripped with the acid or alkali is preferably a layer based on a polymer having silicon pendants, more preferably an acid labile group-bearing silicon pendant polymer. Then the intermediate layer can be stripped in an acceptable manner.

The acid labile group-bearing silicon pendant polymer is preferably defined as comprising recurring units of the general formula (2).

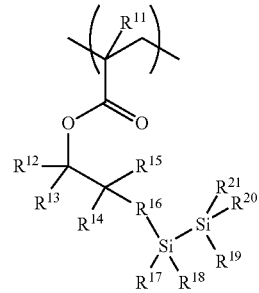

Herein, $R^{11}$ is hydrogen or methyl. $R^{12}$, $R^{13}$, $R^{14}$, and $R^{15}$ are each independently hydrogen or a straight or branched $C_1$-$C_4$ alkyl group. $R^{16}$ is a single bond or a dialkylsilylene group. $R^{17}$, $R^{15}$, $R^{15}$, $R^{20}$, and $R^{21}$ are each independently hydrogen, a straight, branched or cyclic $C_1$-$C_{20}$ alkyl group, a $C_6$-$C_{20}$ aryl group, or a group of the general formula (3) shown below. Alternatively, $R^{17}$, $R^{18}$, $R^{19}$, $R^{20}$, and $R^{21}$ may bond together to form a ring.

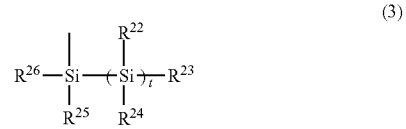

In formula (3), $R^{22}$, $R^{23}$, $R^{24}$, $R^{25}$, and $R^{26}$ are each independently hydrogen, a straight, branched or cyclic $C_2$-$C_{20}$ alkyl group or a $C_6$-$C_{20}$ aryl group, and t is a number of 0 to 10 ($0 \le t \le 10$).

The polymer for use in the silicon-containing intermediate film-forming composition may be synthesized, for example, by dissolving a monomer(s) in an organic solvent, adding a radical or cation polymerization initiator thereto, and effecting heat polymerization. Where a hydroxyl-containing monomer is used, the hydroxyl group on the monomer may be previously substituted by an acetyl group, and the resulting polymer be subjected to alkaline hydrolysis in the organic solvent whereby the acetyl group is deprotected. Examples of the organic solvent which can be used for polymerization include toluene, benzene, tetrahydrofuran, diethyl ether and dioxane. Examples of the radical polymerization initiator used herein include 2,2'-azobisisobutyronitrile (AIBN), 2,2'-azobis(2,4-dimethyl-valeronitrile), dimethyl 2,2-azobis(2-methylpropionate), benzoyl peroxide, and lauroyl peroxide. Preferably the system is heated at 50 to 80° C. for polymerization to take place. Examples of the cation polymerization initiator used herein include acids such as sulfuric acid, phosphoric acid, hydrochloric acid, nitric acid, hypochlorous acid, trichloroacetic acid, trifluoroacetic acid, methanesulfonic acid, trifluoromethanesulfonic acid, camphorsulfonic acid, and tosylic acid; Friedel-Crafts catalysts such as BF, $AlCl_3$, $TiCl_4$ and $SnCl_4$; and cation-providing substances such as $I_2$ and $(C_6H_5)_3CCl$. The reaction time is 2 to 100 hours, preferably 5 to 20 hours.

For alkaline hydrolysis, a base such as aqueous ammonia or triethylamine may be used. The reaction temperature is −20° C. to 100° C., preferably 0° C. to 60° C., and the reaction time is 0.2 to 100 hours, preferably 0.5 to 20 hours.

Preferably the polymer for use in the intermediate film-forming material has a weight average molecular weight in the range of 1,500 to 200,000, more preferably 2,000 to 100,000 as measured versus polystyrene standards by GPC. The molecular weight distribution or dispersity is not critical. If desired, lower and higher molecular weight fractions can be removed by fractionation for reducing the dispersity. It is acceptable to use a mixture of two or more polymers of formula (2) having different molecular weights or dispersities or a mixture of two or more polymers of formula (2) having different compositional ratios.

Both the hydrocarbon-based resist underlayer film-forming composition and the silicon-containing intermediate film-forming composition may further comprise an acid generator for further promoting heat- or otherwise induced crosslinking reaction. While the acid generators include those capable of generating acid by pyrolysis and those capable of generating acid upon radiation exposure, either one may be used herein.

The acid generator to be added to the intermediate film may be a photoacid generator (PAG) so that the exposed region of the film may become dissolved in alkaline developer. In this case, preference is given to a PAG having so high thermal stability that it may not be decomposed during post-application bake (for crosslinking). Sulfonium salt PAGs are preferred. Exemplary acid generators are described in JP-A 2008-111103, paragraphs [0122] to [0142] (U.S. Pat. No. 7,537,880). The acid generators may be used alone or in admixture of two or more. Where a polymerizable PAG is copolymerized in a polymer, it is not always necessary to add the PAG.

An appropriate amount of the PAG added is 0.1 to 50 parts, more preferably 0.5 to 40 parts by weight per 100 parts by weight of the base polymer. With less than 0.1 part of PAG, the amount of acid generated becomes minimal, resulting in the exposed region having an insufficient alkali dissolution rate. If the amount of PAG exceeds 50 parts, a mixing phenomenon may occur as a result of acid migrating to the overlying resist film.

To the silicon-containing intermediate film-forming composition, a basic compound may be added. By adjusting the type and amount of basic compound, the undercut and footing profiles of resist pattern may be modified or corrected. Specifically, if a resist pattern is of footing profile, the amount of a basic compound added is reduced; if a resist pattern is of undercut profile, the amount of a basic compound added is increased.

The basic compound serves to improve contrast by trapping the acid generated by the acid generator to control acid diffusion. Exemplary basic compounds include primary, secondary and tertiary amine compounds, specifically amine compounds having a hydroxyl, ether, ester, lactone, cyano or sulfonic ester group, as described in JP-A 2008-111103, paragraphs [0146] to [0164], and compounds having a carbamate group, as described in JP 3790649. Onium salts such as sulfonium salts, iodonium salts and ammonium salts of sulfonic acids which are not fluorinated at α-position as described in JP-A 2008-158339 (US 20080153030) and similar onium salts of carboxylic acids as described in JP 3991462 may be used as the quencher. Although onium salts of sulfonic acids which are not fluorinated at α-position and onium salts of carboxylic acids lack basicity, they function as a quencher by salt exchange with a super strong acid fluorinated at α-position to neutralize the α-position fluorinated sulfonic acid.

The basic compound is preferably compounded in an amount of 0.001 to 15 parts and more preferably 0.01 to 10 parts by weight per 100 parts by weight of the base polymer. Less than 0.001 part of the basic compound may achieve no addition effect whereas more than 15 parts may result in too low a sensitivity.

The organic solvent which is used in each of the underlayer film-forming composition and the silicon-containing intermediate film-forming composition and resist composition combined therewith is not particularly limited as long as the base resin, acid generator, crosslinker and other additives are soluble therein. Exemplary solvents include ketones such as cyclohexanone, cyclopentanone and methyl-2-amyl ketone; alcohols such as 3-methoxybutanol, 3-methyl-3-methoxybutanol, 1-methoxy-2-propanol, and 1-ethoxy-2-propanol; ethers such as propylene glycol monomethyl ether, ethylene glycol monomethyl ether, propylene glycol monoethyl ether, ethylene glycol monoethyl ether, propylene glycol dimethyl ether, and diethylene glycol dimethyl ether; esters such as propylene glycol monomethyl ether acetate (PGMEA), propylene glycol monoethyl ether acetate, ethyl lactate, ethyl pyruvate, butyl acetate, methyl 3-methoxypropionate, ethyl 3-ethoxypropionate, tert-butyl acetate, tert-butyl propionate, and propylene glycol mono-tert-butyl ether acetate, which may be used alone or in admixture of two or more. Of these, diethylene glycol dimethyl ether, 1-ethoxy-2-propanol, ethyl lactate, PGMEA and mixtures thereof are preferred for use in the underlayer film-forming composition.

The organic solvent is preferably used in an amount of 200 to 10,000 parts, more preferably 300 to 8,000 parts by weight per 100 parts by weight of the total base polymer(s).

Process

Another aspect of the invention is directed to a process for forming a pattern in a substrate by lithography. In one embodiment, the pattern forming process comprises the steps of applying the underlayer film-forming composition onto a substrate to form an underlayer film, forming a silicon-containing intermediate film on the underlayer film, applying a photoresist composition onto the intermediate film to form a resist film thereon, exposing a circuitry region of the resist film to radiation, developing it with a developer to form a resist pattern, dry etching the intermediate film with the resist pattern serving as mask, etching the underlayer film with the intermediate film serving as mask, and etching the substrate for thereby forming a pattern. In a modified embodiment, the process comprises substantially the same steps as above and later steps of implanting ions into the substrate with the underlayer film serving as mask, and stripping the underlayer film in alkaline water. Where the exposed region of the intermediate film is dissolvable in alkaline developer, the step of dry etching the intermediate film with the resist pattern serving as mask may be skipped. Also, where the intermediate film is strippable in alkaline water after dry etching of the substrate or after ion implantation into the substrate, there is the advantage that the intermediate film can be stripped simultaneously with the underlayer film. The intermediate layer may also be stripped using an acid. In this case, the silicon-containing intermediate layer is stripped in a sulfuric acid/aqueous hydrogen peroxide solution or hydrochloric acid/aqueous hydrogen peroxide solution, after which the underlayer film is stripped in alkaline water.

As the alkaline water for stripping the underlayer film, an ammonium hydrogen peroxide solution which is a mixture of ammonia, aqueous hydrogen peroxide and water, commonly referred to as "SC1," is most preferred. Also preferred as the alkaline water are aqueous solutions containing 1 to 99% by weight of ammonia, tetramethylammonium hydroxide (TMAH), choline hydroxide, DBU, DBN, hydroxylamine, and guanidine.

The underlayer film is formed on a substrate. The substrate may be selected from processable substrates, substrates subject to ion implantation, such as Si, $SiO_2$, SiON, SiN, p-Si, α-Si, W, W—Si, Al, Cu, and Al—Si, various low-dielectric films, etch stopper films, and stepped substrates for the Fin-FET technology. The substrate typically has a thickness of 10 to 10,000 nm, especially 20 to 5,000 nm.

Between the processable substrate and the underlayer film, a hard mask may be disposed which helps to process the processable substrate. The hard mask may be made of SiN, SiON, p-Si, α-Si, W, W—Si or amorphous carbon when the processable substrate is a $SiO_2$ based insulating film substrate; and $SiO_2$, SiN or SiON when the processable substrate is a gate electrode such as p-Si, W—Si or Al—Si.

Referring to the underlayer film forming method, the underlayer film may be formed on the substrate by any methods commonly used in the formation of photoresist film, such as spin coating. The underlayer film-forming composition is applied by such technique as spin coating, the organic solvent is evaporated off to form a resist underlayer film, and the underlayer film is desirably baked to promote crosslinking reaction to prevent intermixing with any resist film. The bake is preferably at a temperature of 80 to 300° C. for 10 to 300 seconds. The resist underlayer film may have any desired thickness. The film thickness is preferably in a range of 5 to 10,000 nm, especially 10 to 5,000 nm. The film thickness may be selected from the range that ensures a satisfactory antireflective effect. After the resist underlayer film is formed, a silicon-containing intermediate film and a resist film are formed thereon in the case of the trilayer process.

When the trilayer process is applied, the silicon-containing intermediate film should preferably have optimum optical constants (m, k values) for antireflective effect, as described in JP-A 2006-293207, specifically a n value of 1.5 to 1.9, a k value of 0.15 to 0.3, and a thickness of 20 to 130 nm. Likewise, the underlayer film has a n value of 1.3 to 1.8, a k value of 0.2 to 0.8, and a thickness of at least 50 nm.

In the photoresist composition for forming the resist film, base polymers of well-known hydrocarbon components as described in JP-A H09-73173 and 2000-336121, for example, may be used. Although the thickness of the resist film is not particularly limited, it preferably has a thickness of 20 to 500 nm, more preferably 30 to 400 nm.

When the photoresist composition is applied to form the resist film, such techniques as spin coating are preferably used as is the case when the underlayer film is formed. After the photoresist composition is applied as by spin coating, it is prebaked preferably at 80 to 180° C. for 10 to 300 seconds to form the resist film.

Subsequently, as in the standard technology, the process proceeds through steps of exposure of a circuitry region of the resist film to radiation, post-exposure bake (PEB), and development until a resist pattern is formed. Where a silicon-containing intermediate film is formed from a composition comprising a polymer having a silicon-containing acid labile group as pendant and an acid generator, a pattern of the intermediate film is formed at the same time as the resist pattern is formed via exposure and development.

A resist protective film may be applied on top of the resist film. The resist protective film may have an antireflective function as well and be made of either water-soluble or water-insoluble material. The water-insoluble materials include a first class of materials dissolvable in alkaline developer and a second class of materials not dissolvable in alkaline developer, but strippable in fluorinated solvents. From the process aspect, the first class of materials is advantageous in that it can be stripped at the same time as development of the resist film. Where the immersion lithography is applied, a protective film is provided in some cases for the purposes of preventing acid generator and other additives from being leached out of the resist film, and improving water slip. The protective film should preferably have the nature that it is not dissolved in water, but in alkali. Thus the preferred protective film-forming material is a solution having a polymer with α-trifluoromethylhydroxy group dissolved in a higher alcohol of at least 4 carbon atoms or an ether compound of 8 to 12 carbon atoms. The protective film is formed by spin coating the solution onto the prebaked resist film and prebaking. The protective film preferably has a thickness of 10 to 200 nm. The dry or immersion exposure is followed by PEB and development in an alkaline developer for 10 to 300 seconds. As the alkaline developer, a 2.38 wt % tetramethylammonium hydroxide (TMAH) aqueous solution is widely used. Where a protective film soluble in developer is used, stripping of the protective film and development of the resist film can be conducted at the same time.

If residual water is on the resist film prior to PEB, the water functions to suck up the acid from within the resist film during PEB, with a failure of pattern formation. For the purpose of completely removing water on the resist film prior to PEB, it is necessary to dry or recover water on the film by suitable means, for example, spin drying prior to PEB, purging the film surface with dry air or nitrogen, or optimizing the water recovery nozzle configuration or water recovery process at a post-exposure stage.

Development may be carried out in an alkaline aqueous solution by such a technique as puddle or dip technique. Preferably puddle development is carried out in a 2.38 wt % aqueous solution of TMAH, typically at room temperature for 10 to 300 seconds. The structure is then rinsed with deionized water and dried by spin drying, nitrogen blow or the like. During alkaline development, the exposed region of the positive resist film is dissolved away, and preferably the exposed region of the silicon-containing intermediate film is simultaneously dissolved away.

If the size of the resist pattern as developed deviates from the desired size, it is necessary to form a new resist pattern by stripping the resist film, and coating a second resist film, followed by a second set of exposure and development. In this case, problems arise if only the resist film is stripped. Namely, when the second resist film is coated and patterned, problems like footing of the second resist pattern and a change of sensitivity arise because the silicon-containing intermediate film has been affected by the first set of exposure and development. It is then necessary to strip not only the resist film, but also the silicon-containing intermediate film. Where the resist film and the silicon-containing intermediate film are stripped, sometimes the underlayer film can be damaged whereby the thickness of the underlayer film is reduced. If the thickness of the underlayer film is reduced, then it fails to exert necessary dry etch resistance. It is thus concluded desirable that all films including from the resist film to the underlayer film are stripped off.

Since the silicon-containing intermediate layer comes in contact with the alkaline developer during development of the resist film, it must have alkali resistance enough to withstand any film thickness loss by the developer. This suggests that it is difficult to strip the intermediate layer in an alkaline solution. With respect to stripping after the formation of a resist pattern by development, in a common practice, the resist film is stripped by dry ashing with oxygen gas, and the silicon-containing intermediate layer is stripped by dry etching with fluorocarbon base gas or using an acid solution.

While the resist pattern after exposure and development and the underlying silicon-containing intermediate film serve as mask, the hydrocarbon-based underlayer film is etched, typically by a dry etching technique. In the case of the silicon-containing intermediate film of the type wherein the exposed region is not dissolved in alkaline developer, the silicon-containing intermediate film must be processed with fluorocarbon gas while the resist pattern serves as mask. This step may be skipped in the case of the intermediate film of the type wherein the exposed region turns soluble in alkaline developer under the action of acid. Dry etching of the underlayer film is carried out with oxygen gas or hydrogen gas, to which He, Ar, another inert gas, CO, $CO_2$, $NH_3$, $SO_2$, $N_2$, or $NO_2$ gas may be added. The substrate is then processed by etching. Etching is carried out with a gas composed mainly of fluorocarbon gas when the substrate is $SiO_2$ or SiN, and with a gas composed mainly of chlorine or bromine gas when the substrate is polysilicon (p-Si), Al or W. In the case of ion implantation, processing of the substrate is not necessarily needed. Ions are implanted into the substrate while the underlayer film pattern serves as mask. At the end of ion implantation, the silicon-containing intermediate film and the underlayer film are stripped off. Particularly when the silicon-containing intermediate film has been crosslinked via acetal of vinyl ether, the intermediate film can be stripped with sulfuric acid or hydrochloric acid because the bond is decomposable with acid. The stripper solution may contain aqueous hydrogen peroxide. The silicon-containing intermediate film may also be stripped by dry etching with fluorocarbon gas.

Next, the underlayer film is stripped. In alkaline water at pH 9 or above, naphtholphthalein opens its ring to generate a carboxyl group so that the film becomes readily dissolvable in alkaline water. SPM solution which is a mixture of sulfuric acid and aqueous hydrogen peroxide is a strong stripper capable of dissolving cured organic films. However, where the substrate is a silicon substrate, for example, the solution forms an oxide film on the substrate surface. If an electrically insulating layer in the form of silicon oxide film is formed on the surface of the ion implanted silicon substrate, it inhibits electron migration and so semiconductor performance is degraded. It is thus concluded that an underlayer film which is strippable with a peroxide-free stripper is preferable. Alkaline water does not form an oxide film on the substrate surface.

The alkaline water which can be used as the stripper is an aqueous solution containing 1 to 99% by weight of at least one member selected from the group consisting of ammonia, ammonia hydrogen peroxide water (i.e., mixture of ammonia, aqueous hydrogen peroxide and water), tetramethylammonium hydroxide (TMAH), tetraethylammonium hydroxide, tetrapropylammonium hydroxide, tetrabutylammonium hydroxide, choline hydroxide, benzyltrimethylammonium hydroxide, benzyltriethylammonium hydroxide, DBU, DBN, hydroxylamine, 1-butyl-1-methylpyrrolidinium hydroxide, 1-propyl-1-methylpyrrolidinium hydroxide, 1-butyl-1-methylpiperidinium hydroxide, 1-propyl-1-methylpiperidinium hydroxide, mepiquathydroxide, trimethylsulfonium hydroxide, hydrazines, ethylenediamines, and guanidines.

The stripping step is typically at a temperature of 10 to 100° C. for 10 to 30 minutes. Heating accelerates the stripping rate, but causes more damage to the substrate. It is thus necessary to find an optimum balance of stripper concentration, stripping time and temperature. At the end of stripping, the substrate is cleaned with deionized water to remove the stripper and dried. Before or after stripping with alkaline water, a stripper solution of acidic water such as SP2 or SPM may also be used.

Figure 1B:
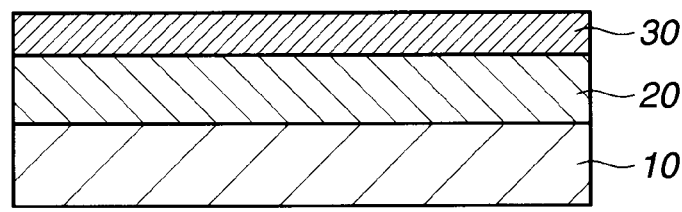
Figure 1C:
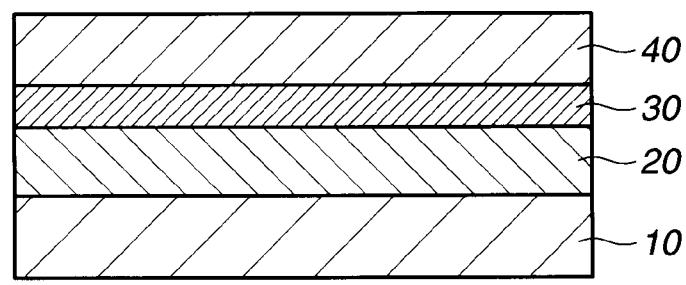
Figure 1D:
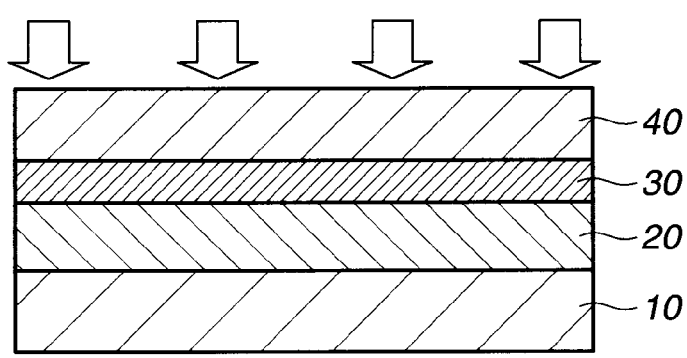

FIGS. 1 and 2 illustrate the pattern forming process in one embodiment of the invention. In FIG. 1 (A), a hydrocarbon underlayer film 20 is formed on a substrate 10. If desired, a silicon-containing intermediate film 30 is formed thereon, as shown in (B), and a resist film 40 is formed thereon, as shown in (C). In (D), the selected region of the resist film 40 is exposed to radiation. In FIG. 2 (E), the resist film 40 is PEB and developed to form a resist pattern. In this embodiment, the exposed region of resist film 40 and underlying silicon-containing intermediate film 30 are dissolved during development. In (F), the underlayer film 20 is processed by dry etching with $H_2$ gas while the intermediate film serves as mask. In (G), ions are implanted into the bare region of substrate 10 while the underlayer film 20 serves as mask. The ion-implanted region of substrate is depicted at 10b. Finally, the trilayer is stripped off, leaving the substrate 10 having ion-implanted regions 10b as shown in (H).

EXAMPLE

Examples of the invention are given below by way of illustration and not by way of limitation.

Synthesis Example

Synthesis of Novolak Resin

A substituted or unsubstituted naphtholphthalein was combined with a co-condensable compound, 37 wt % formalin, and oxalic acid, which was stirred at 100° C. for 24 hours. At the end of reaction, the reaction product was poured into 500 ml of methyl isobutyl ketone, which was thoroughly washed with water to remove the catalyst and metal impurities. The solvent was removed under reduced pressure. The system was further evacuated to 2 mmHg at 150° C., for removing water and unreacted monomers. In this way, Novolak Resins 1 to 18 and Comparative Novolak Resins 1 to 3 were similarly prepared except the following changes.

Novolak Resin 6 was prepared using 6-hydroxy-2-naphthaldehyde instead of 37 wt % formalin. Novolak Resin 7 was prepared using 3-furancarboxyaldehyde instead of 37 wt % formalin. Novolak Resin 8 was prepared using 3-thiophene aldehyde instead of 37 wt % formalin. Novolak Resin 13 was prepared using a 50 wt % dioxane solution of Aldehyde 1 (shown below) instead of 37 wt % formalin. Novolak Resin 14 was prepared using a 50 wt % dioxane solution of Aldehyde 2 (shown below) instead of 37 wt % formalin. Novolak Resin 15 was prepared using a 50 wt % dioxane solution of Aldehyde 3 (shown below) instead of 37 wt % formalin. Novolak Resin 16 was prepared using a 50 wt % dioxane solution of Aldehyde 4 (shown below) instead of 37 wt % formalin. Novolak Resin 17 was prepared using a 50 wt % dioxane solution of Aldehyde 5 (shown below) instead of 37 wt % formalin. Novolak Resin 18 was prepared using a 50 wt % dioxane solution of Aldehyde 6 (shown below) instead of 37 wt % formalin.

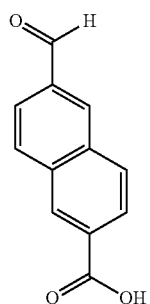
Aldehyde 1
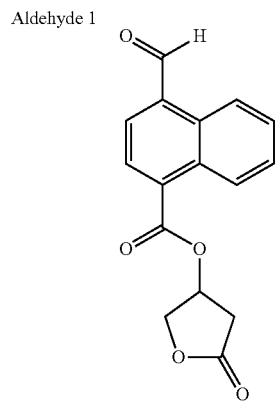
Aldehyde 2
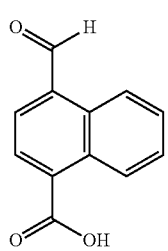
Aldehyde 3
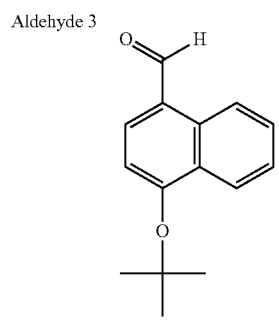
Aldehyde 4
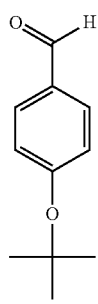
Aldehyde 5
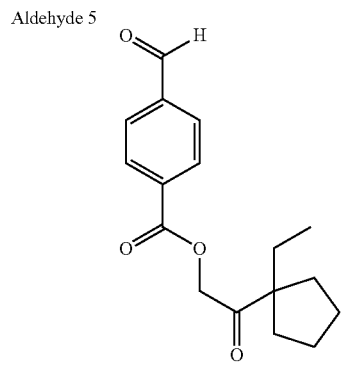
Aldehyde 6
Novolak Resin 1
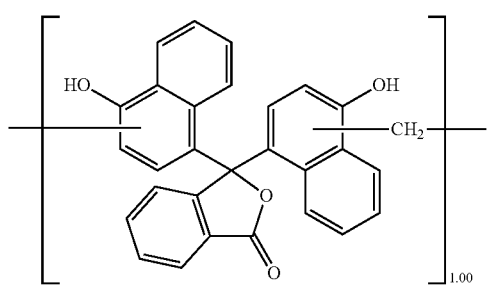
Novolak Resin 1
Mw = 2,200
Mw/Mn = 3.60

-continued
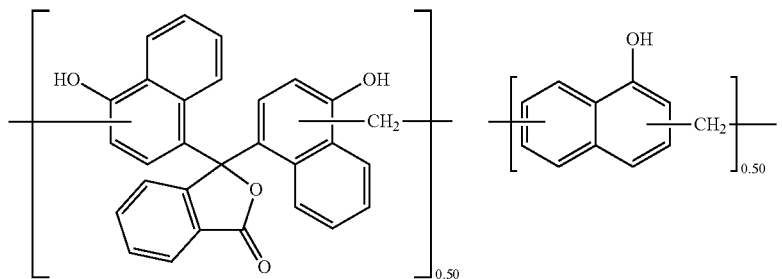
Novolak Resin 2
Mw = 2,100
Mw/Mn = 4.17
Novolak Resin 2
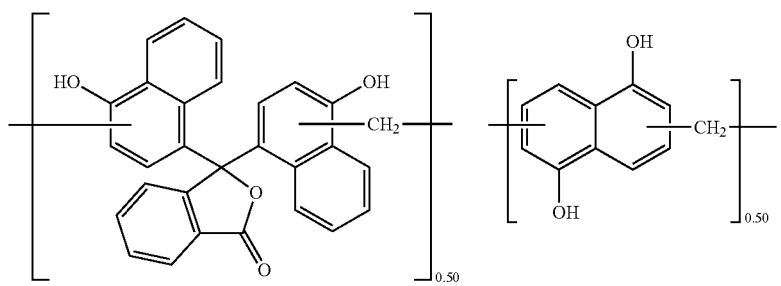
Novolak Resin 3
Mw = 2,600
Mw/Mn = 3.38
Novolak Resin 3
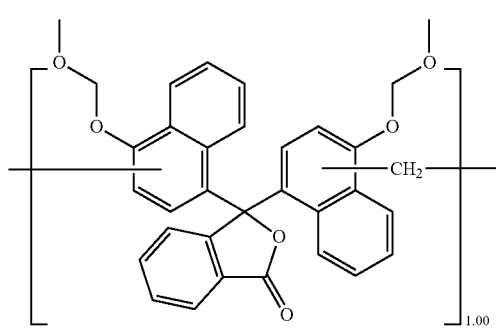
Novolak Resin 4
Mw = 2,300
Mw/Mn = 2.69
Novolak Resin 4
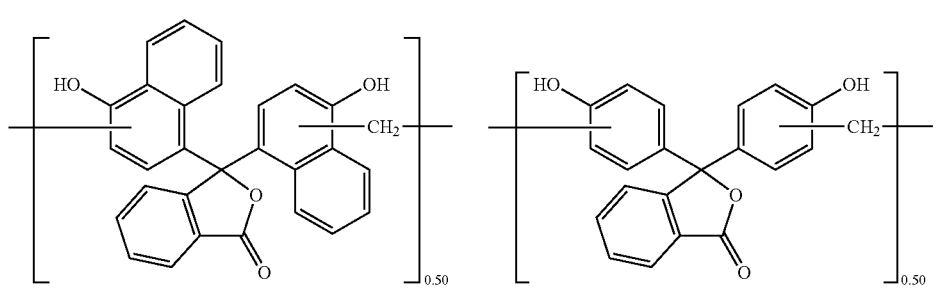
Novolak Resin 5
Mw = 6,200
Mw/Mn = 5.20
Novolak Resin 5

-continued
Novolak Resin 6
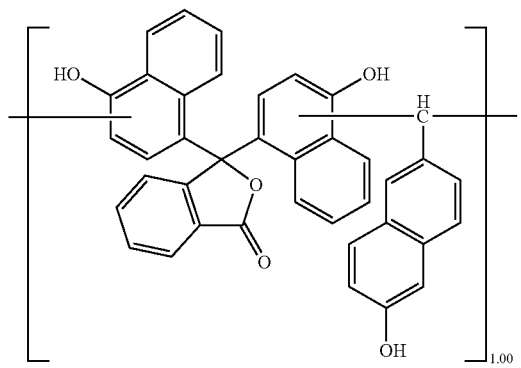
Novolak Resin 6
Mw = 2,100
Mw/Mn = 4.10
Novolak Resin 7
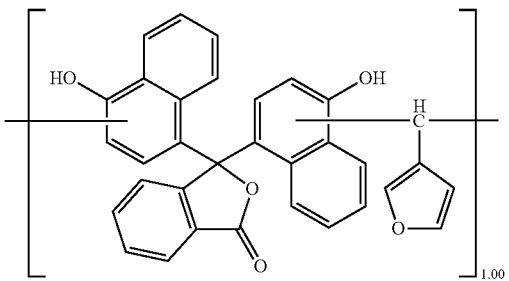
Novolak Resin 7
Mw = 3,100
Mw/Mn = 3.33
Novolak Resin 8
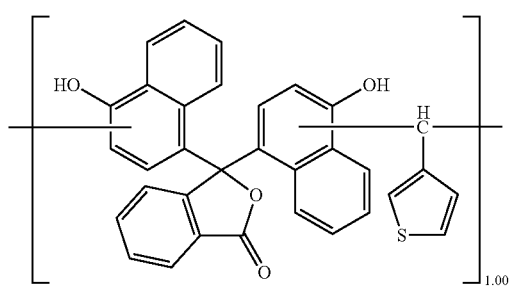
Novolak Resin 8
Mw = 4,100
Mw/Mn = 4.10
Novolak Resin 9
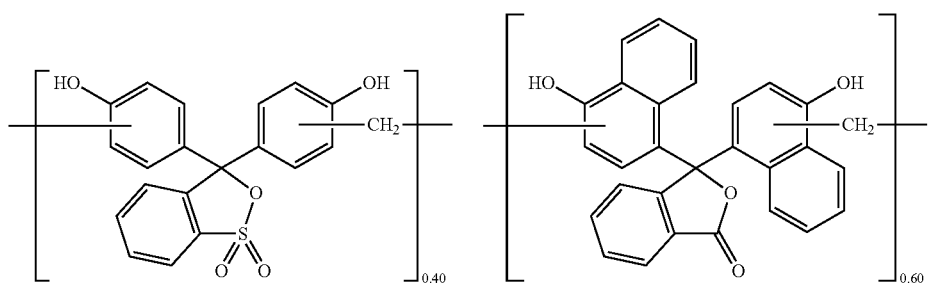
Novolak Resin 9
Mw = 2,700
Mw/Mn = 3.90
Novolak Resin 10
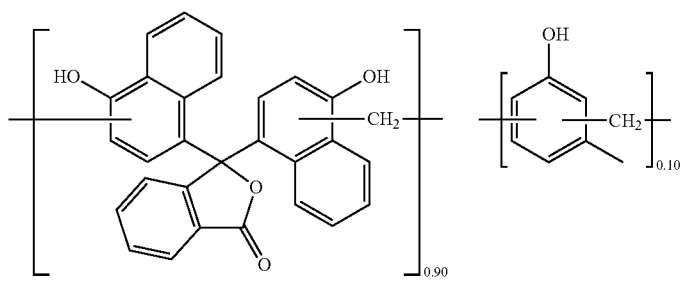
Novolak Resin 10
Mw = 3,500
Mw/Mn = 4.10

Novolak Resin 11
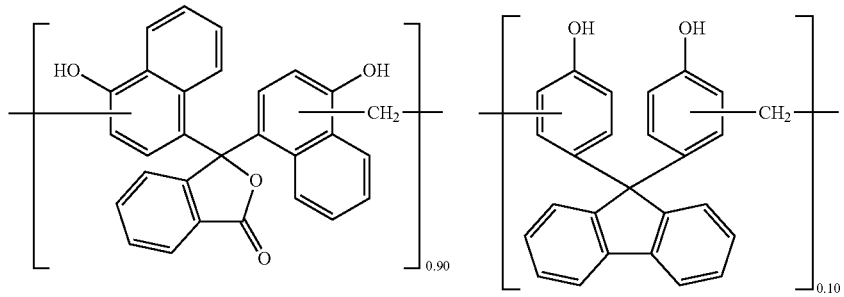
Novolak Resin 11
Mw = 3,300
Mw/Mn = 4.30
Novolak Resin 12
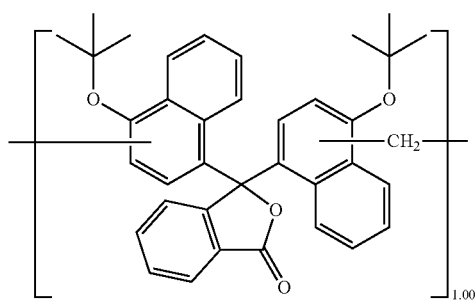
Novolak Resin 12
Mw = 2,500
Mw/Mn = 3.70
Novolak Resin 13
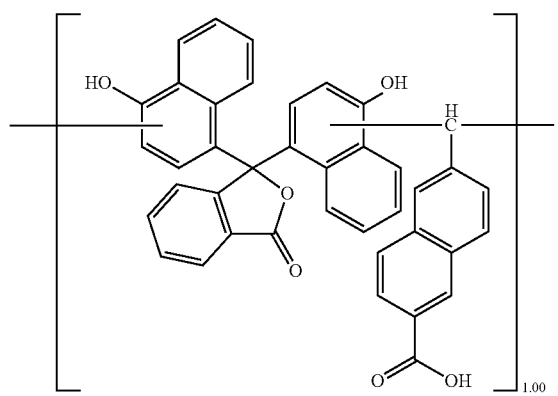
Novolak Resin 13
Mw = 3,200
Mw/Mn = 3.60
Novolak Resin 14
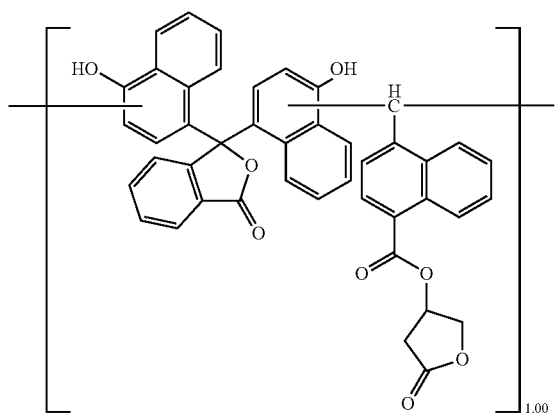
Novolak Resin 14
Mw = 3,300
Mw/Mn = 3.70
Novolak Resin 15
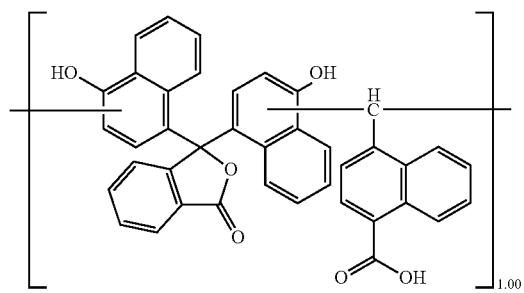
Novolak Resin 15
Mw = 2,500
Mw/Mn = 3.60

-continued
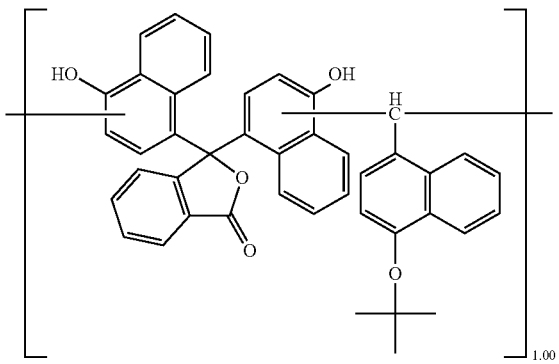
Novolak Resin 16
Mw = 2,800
Mw/Mn = 3.90
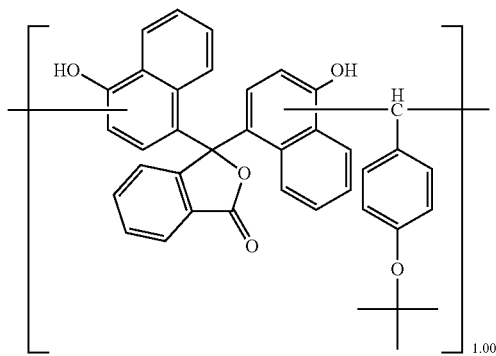
Novolak Resin 17
Mw = 2,900
Mw/Mn = 4.90
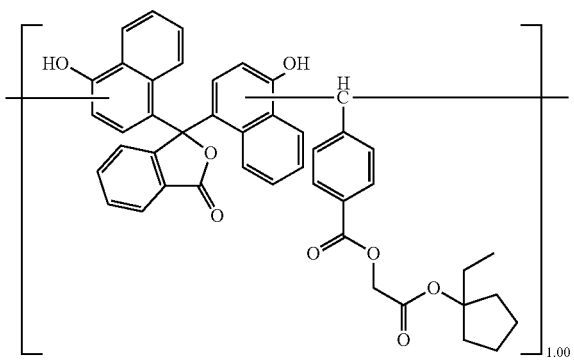
Novolak Resin 18
Mw = 3,900
Mw/Mn = 5.90
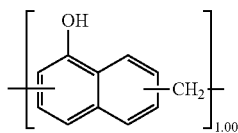
Comparative Novolak Resin 1
Mw = 1,800
Mw/Mn = 3.33
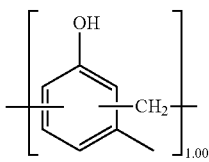
Comparative Novolak Resin 2
Mw = 6,900
Mw/Mn = 5.53
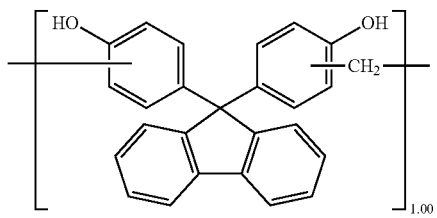
Comparative Novolak Resin 3
Mw = 6,800
Mw/Mn = 5.53

The crosslinker, acid generator, quencher and solvent used in Examples are identified below.

Crosslinker:

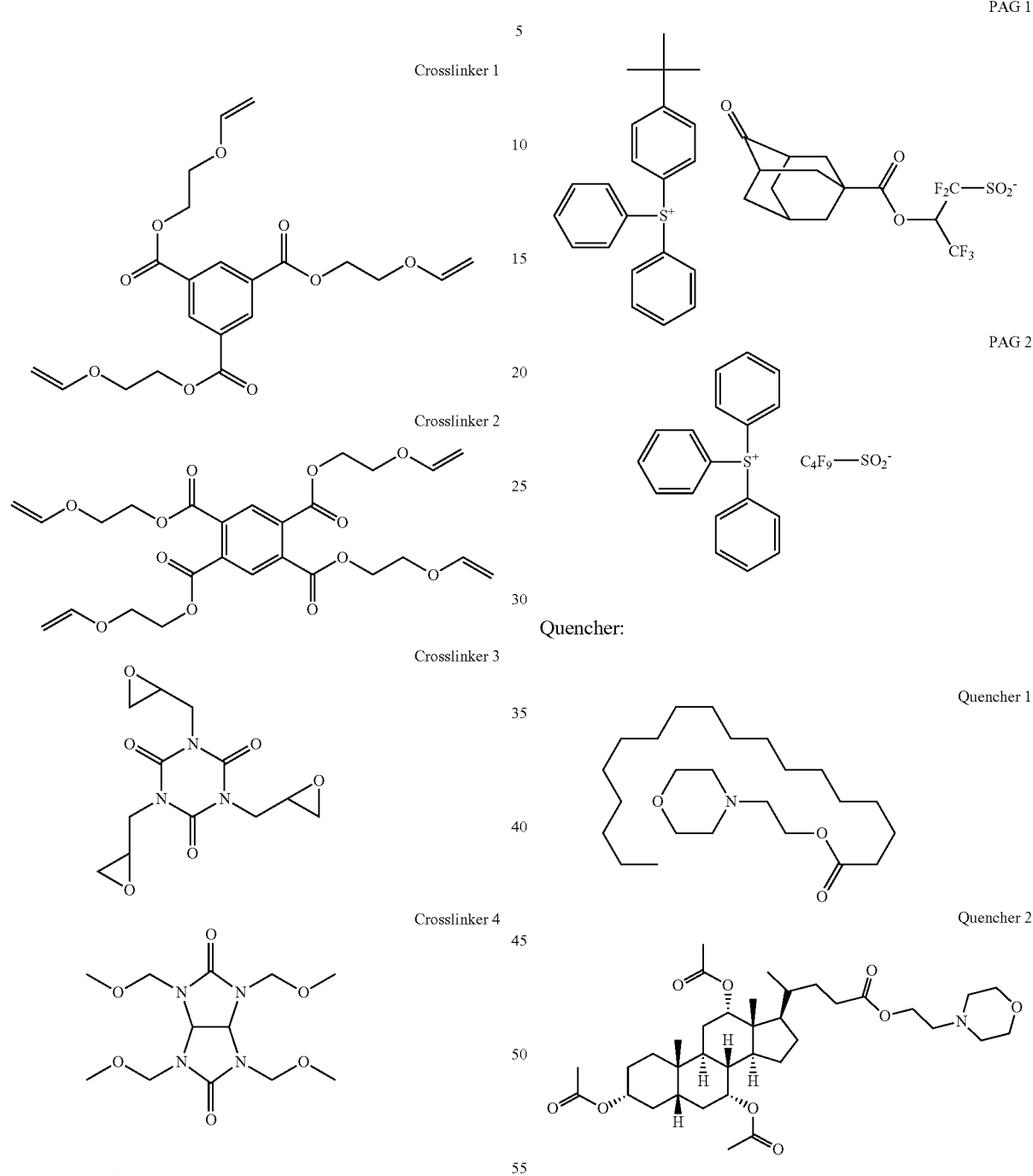

Thermal Acid Generator:

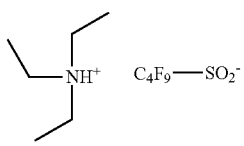

Photoacid Generator:

Quencher:

Organic Solvent:
PGMEA (propylene glycol monomethyl ether acetate)
CyH (cyclohexane)

Examples and Comparative Examples

Preparation of Underlayer Film-Forming Composition

Resist underlayer film-forming compositions (Examples 1 to 18 and Comparative Examples 1 to 3) were prepared by dissolving Novolak Resins 1 to 18 and Comparative Novolak Resins 1 to 3, acid generator TAG1, and Crosslinkers 1 to 4 in an organic solvent according to the formulation shown in Table 1 and filtering through a fluoro-resin filter with a pore size of 0.1 μm. The organic solvent contained 0.1 wt % of surfactant FC-4430 (3M-Sumitomo Co., Ltd.).

Each of the compositions in solution form was coated onto a silicon substrate and baked at 200° C. for 60 seconds to form a resist underlayer (antireflective) film of 100 nm thick (Underlayer films 1 to 18 and Comparative underlayer films 1 to 3). Using a variable angle spectroscopic ellipsometer (VASE®) of J. A. Woollam Co., the underlayer films were measured for optical constants (refractive index n, extinction coefficient k) at wavelength 193 nm. The results are also shown in Table 1.

Preparation of Intermediate Film-Forming Composition

A silicon-containing intermediate film-forming composition was prepared by dissolving a resin, i.e., Silicon-containing polymer 1 (shown below), acid generator PAG2, quencher, and Crosslinker 1 in an organic solvent according to the formulation shown in Table 2 and filtering through a fluoro-resin filter with a pore size of 0.1 μm. The organic solvent contained 0.1 wt % of surfactant FC-4430 (3M-Sumitomo Co., Ltd.).

The composition in solution form was coated onto a silicon substrate and baked at 200° C. for 60 seconds to form a silicon-containing intermediate film 1 of 40 nm thick. Using

TABLE 1

|  |  |  | Polymer (pbw) | Acid generator (pbw) | Crosslinker (pbw) | Organic solvent (pbw) | n | k |
|---|---|---|---|---|---|---|---|---|
| Example | 1 | Underlayer film 1 | Novolak Resin 1 (100) | — | Crosslinker 1 (20) | PGMEA (2,500) | 1.44 | 0.40 |
|  | 2 | Underlayer film 2 | Novolak Resin 2 (100) | — | Crosslinker 2 (20) | PGMEA (2,500) | 1.41 | 0.42 |
|  | 3 | Underlayer film 3 | Novolak Resin 3 (100) | TAG 1 (2.0) | Crosslinker 3 (20) | PGMEA (2,500) | 1.43 | 0.41 |
|  | 4 | Underlayer film 4 | Novolak Resin 4 (100) | TAG 1 (2.0) | Crosslinker 4 (20) | PGMEA (2,500) | 1.45 | 0.40 |
|  | 5 | Underlayer film 5 | Novolak Resin 5 (100) | TAG 1 (2.0) | Crosslinker 4 (20) | PGMEA (2,500) | 1.40 | 0.48 |
|  | 6 | Underlayer film 6 | Novolak Resin 6 (100) | TAG 1 (2.0) | Crosslinker 4 (20) | PGMEA (2,500) | 1.44 | 0.41 |
|  | 7 | Underlayer film 7 | Novolak Resin 7 (100) | TAG 1 (2.0) | Crosslinker 4 (20) | PGMEA (2,500) | 1.49 | 0.42 |
|  | 8 | Underlayer film 8 | Novolak Resin 8 (100) | TAG 1 (2.0) | Crosslinker 4 (20) | PGMEA (2,500) | 1.52 | 0.41 |
|  | 9 | Underlayer film 9 | Novolak Resin 9 (100) | TAG 1 (2.0) | Crosslinker 4 (20) | PGMEA (2,500) | 1.40 | 0.48 |
|  | 10 | Underlayer film 10 | Novolak Resin 10 (100) | TAG 1 (2.0) | Crosslinker 4 (20) | PGMEA (2,500) | 1.39 | 0.49 |
|  | 11 | Underlayer film 11 | Novolak Resin 11 (100) | TAG 1 (2.0) | Crosslinker 4 (20) | PGMEA (2,500) | 1.41 | 0.49 |
|  | 12 | Underlayer film 12 | Novolak Resin 12 (100) | TAG 1 (2.0) | Crosslinker 4 (20) | PGMEA (2,500) | 1.40 | 0.42 |
|  | 13 | Underlayer film 13 | Novolak Resin 13 (100) | TAG 1 (2.0) | Crosslinker 4 (20) | PGMEA (2,500) | 1.41 | 0.42 |
|  | 14 | Underlayer film 14 | Novolak Resin 14 (100) | TAG 1 (2.0) | Crosslinker 4 (20) | PGMEA (2,500) | 1.49 | 0.40 |
|  | 15 | Underlayer film 15 | Novolak Resin 15 (100) | TAG 1 (2.0) | Crosslinker 4 (20) | PGMEA (2,500) | 1.48 | 0.41 |
|  | 16 | Underlayer film 16 | Novolak Resin 16 (100) | TAG 1 (2.0) | Crosslinker 4 (20) | PGMEA (2,500) | 1.44 | 0.42 |
|  | 17 | Underlayer film 17 | Novolak Resin 17 (100) | TAG 1 (2.0) | Crosslinker 4 (20) | PGMEA (2,500) | 1.48 | 0.43 |
|  | 18 | Underlayer film 18 | Novolak Resin 18 (100) | TAG 1 (2.0) | Crosslinker 4 (20) | PGMEA (2,000) CyH (500) | 1.38 | 0.48 |
| Comparative Example | 1 | Comparative underlayer film 1 | Comparative Novolak Resin 1 (100) | TAG 1 (2.0) | Crosslinker 4 (20) | PGMEA (4,000) | 1.40 | 0.36 |
|  | 2 | Comparative underlayer film 2 | Comparative Novolak Resin 2 (100) | TAG 1 (2.0) | Crosslinker 4 (20) | PGMEA (4,000) | 1.39 | 0.69 |
|  | 3 | Comparative underlayer film 3 | Comparative Novolak Resin 3 (100) | TAG 1 (2.0) | Crosslinker 4 (20) | PGMEA (4,000) | 1.42 | 0.61 |

As seen from Table 1, the resist underlayer films of Examples 1 to 18 have a refractive index (n) in the range of 1.3 to 1.6 and an extinction coefficient (k) in the range of 0.3 to 0.7, that is, optimum optical constants to exert a satisfactory antireflective effect at a film thickness of at least 30 nm.

a variable angle spectroscopic ellipsometer (VASE®) of J. A. Woollam Co., the silicon-containing intermediate film 1 was measured for optical constants (refractive index n, extinction coefficient k) at wavelength 193 nm. The results are also shown in Table 2.

TABLE 2

| | Polymer (pbw) | Acid generator (pbw) | Quencher (pbw) | Crosslinker (pbw) | Organic solvent | n | k |
|---|---|---|---|---|---|---|---|
| Silicon-containing intermediate film 1 | Silicon-containing polymer 1 (100) | PAG 2 (7.0) | Quencher 2 (2.0) | Crosslinker 1 (20) | PGMEA (4,000) | 1.61 | 0.33 |

Silicon-containing polymer 1
Mw = 8,900
Mw/Mn = 1.88

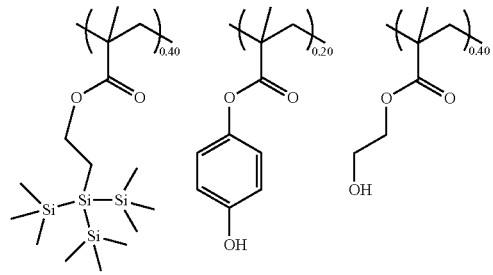

Silicon-containing polymer 1

Preparation of ArF Resist Film-Forming Composition

An ArF resist toplayer film-forming composition was prepared by dissolving Resist Polymer 1 (shown below), acid generator PAG1, and quencher in an organic solvent according to the formulation shown in Table 3 and filtering through a fluoro-resin filter with a pore size of 0.1 μm. The organic solvent contained 0.1 wt % of surfactant FC-4430 (3M-Sumitomo Co., Ltd.).

TABLE 3

| | Polymer (pbw) | Acid generator (pbw) | Quencher (pbw) | Solvent (pbw) |
|---|---|---|---|---|
| ArF resist 1 | Resist Polymer 1 (100) | PAG 1 (8.0) | Quencher 1 (2.0) | PGMEA (2,000) |

Resist Polymer 1
Mw = 7,500
Mw/Mn = 1.92

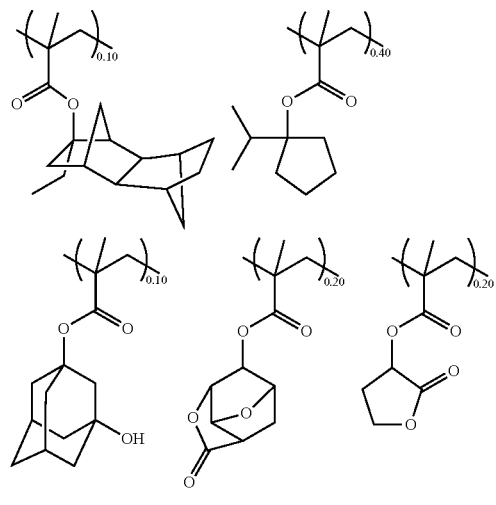

Resist Polymer 1

Preparation of Ammonia Hydrogen Peroxide Solution SC1

A solution SC1 was prepared by mixing ammonia, aqueous hydrogen peroxide and water in a ratio of 1:1:5.

Preparation of Hydrochloric Acid Hydrogen Peroxide Solution SC2

A solution SC2 was prepared by mixing hydrochloric acid, aqueous hydrogen peroxide and water in a ratio of 1:1:5.

Each of the underlayer film-forming compositions in solution form (Examples 1 to 18 and Comparative Examples 1 to 3) was coated onto a silicon substrate and baked at 200° C. for 60 seconds to form an underlayer film of 100 nm thick (Underlayer films 1 to 18 and Comparative underlayer films 1 to 3). As a test for examining whether or not the film was strippable in ammonia hydrogen peroxide solution, the silicon substrates in Examples 1 to 18 and Comparative Examples 1 to 3 were immersed in ammonia hydrogen peroxide solution SC1 at 70° C. for 5 minutes, after which the thickness of the underlayer film was measured. Similarly, the coated substrate in Example 19 was immersed in 10 wt % TMAH aqueous solution at 23° C. for 5 minutes, and the coated substrate in Example 20 was immersed in 25 wt % TMAH aqueous solution at 23° C. for 1 minute, for examining whether or not the film was strippable in the relevant solution. The results are shown in Table 4.

TABLE 4

| | | | Film thickness after wafer immersion (nm) |
|---|---|---|---|
| Example | 1 | Underlayer film 1 | 0 |
| | 2 | Underlayer film 2 | 0 |
| | 3 | Underlayer film 3 | 0 |
| | 4 | Underlayer film 4 | 0 |
| | 5 | Underlayer film 5 | 0 |
| | 6 | Underlayer film 6 | 0 |
| | 7 | Underlayer film 7 | 0 |
| | 8 | Underlayer film 8 | 0 |
| | 9 | Underlayer film 9 | 0 |
| | 10 | Underlayer film 10 | 0 |
| | 11 | Underlayer film 11 | 0 |
| | 12 | Underlayer film 12 | 0 |
| | 13 | Underlayer film 13 | 0 |
| | 14 | Underlayer film 14 | 0 |
| | 15 | Underlayer film 15 | 0 |
| | 16 | Underlayer film 16 | 0 |
| | 17 | Underlayer film 17 | 0 |

TABLE 4-continued

|  |  |  | Film thickness after wafer immersion (nm) |
|---|---|---|---|
|  | 18 | Underlayer film 18 | 0 |
|  | 19 | Underlayer film 1 | 0 |
|  | 20 | Underlayer film 1 | 0 |
| Comparative Example | 1 | Comparative underlayer film 1 | 93 |
|  | 2 | Comparative underlayer film 2 | 98 |
|  | 3 | Comparative underlayer film 3 | 99 |

As seen from Table 4, Underlayer films 1 to 18 are strippable in ammonia hydrogen peroxide solution SC1 whereas Comparative underlayer films 1 to 3 are not strippable because the majority of film is left after immersion.

Pattern Etching Test

Each of the underlayer film-forming compositions in solution form (Examples 1 to 18 and Comparative Example 1) was coated onto a silicon wafer substrate and baked at 200° C. for 60 seconds to form an underlayer film of 100 nm thick (Underlayer films 1 to 18 and Comparative underlayer film 1). The silicon-containing intermediate film-forming composition in solution form was coated on the underlayer film and baked at 200° C. for 60 seconds to form an intermediate film of 40 nm thick. The ArF resist toplayer film-forming composition in solution form was coated on the intermediate film and baked at 105° C. for 60 seconds to form a photoresist film of 100 nm thick.

Using an ArF immersion stepper model NSR—S610C (Nikon Corp., NA 1.30, σ0.98/0.65, 35° dipole/s-polarized illumination), the coated substrate was exposed through a 6% halftone phase shift mask. The resist film was baked (PEB) at 100° C. for 60 seconds and then developed in a 2.38 wt % TMAH aqueous solution for 30 seconds to form a positive 45 nm 1:1 line-and-space pattern. Since the silicon-containing intermediate film used herein is of the type wherein the exposed region turns dissolvable in alkaline developer, a pattern of silicon-containing intermediate film was formed as a result of development at the same time as the resist pattern.

The structure was dry etched using an etching instrument Telius by Tokyo Electron, Ltd. Specifically, the underlayer film was processed with the silicon-containing intermediate film made mask.

| Transfer conditions of intermediate film to underlayer film | |
|---|---|
| Chamber pressure | 2.0 Pa |
| RF power | 500 W |
| Ar gas flow rate | 30 ml/min |
| H$_2$ gas flow rate | 60 ml/min |
| Time | 180 sec |

The film patterns in cross section were observed under electron microscope S-4700 (Hitachi, Ltd.) to compare their profile.

Thereafter, the silicon-containing intermediate film was stripped by immersion in SC2 at 60° C. for 3 minutes, and in Examples 1 to 18, the underlayer film was stripped by immersion in SC1 at 70° C. for 3 minutes. This was done in Example 19 by immersion in 10 wt % TMAH aqueous solution at 23° C. for 5 minutes, and in Example 20 by immersion in 25 wt % TMAH aqueous solution at 23° C. for 1 minute. The results are shown in Table 5.

TABLE 5

|  |  | Underlayer film | Silicon-containing intermediate film | ArF resist toplayer film | Resist profile as developed | Underlayer film profile | Residual film after stripping |
|---|---|---|---|---|---|---|---|
| Example | 1 | Underlayer film 1 | Silicon-containing intermediate layer 1 | ArF resist 1 | Perpendicular | Perpendicular | No residual |
|  | 2 | Underlayer film 2 | Silicon-containing intermediate layer 1 | ArF resist 1 | Perpendicular | Perpendicular | No residual |
|  | 3 | Underlayer film 3 | Silicon-containing intermediate layer 1 | ArF resist 1 | Perpendicular | Perpendicular | No residual |
|  | 4 | Underlayer film 4 | Silicon-containing intermediate layer 1 | ArF resist 1 | Perpendicular | Perpendicular | No residual |
|  | 5 | Underlayer film 5 | Silicon-containing intermediate layer 1 | ArF resist 1 | Perpendicular | Perpendicular | No residual |
|  | 6 | Underlayer film 6 | Silicon-containing intermediate layer 1 | ArF resist 1 | Perpendicular | Perpendicular | No residual |
|  | 7 | Underlayer film 7 | Silicon-containing intermediate layer 1 | ArF resist 1 | Perpendicular | Perpendicular | No residual |
|  | 8 | Underlayer film 8 | Silicon-containing intermediate layer 1 | ArF resist 1 | Perpendicular | Perpendicular | No residual |
|  | 9 | Underlayer film 9 | Silicon-containing intermediate layer 1 | ArF resist 1 | Perpendicular | Perpendicular | No residual |
|  | 10 | Underlayer film 10 | Silicon-containing intermediate layer 1 | ArF resist 1 | Perpendicular | Perpendicular | No residual |
|  | 11 | Underlayer film 11 | Silicon-containing intermediate layer 1 | ArF resist 1 | Perpendicular | Perpendicular | No residual |

TABLE 5-continued

|  | Underlayer film | Silicon-containing intermediate film | ArF resist toplayer film | Resist profile as developed | Underlayer film profile | Residual film after stripping |
|---|---|---|---|---|---|---|
| 12 | Underlayer film 12 | Silicon-containing intermediate layer 1 | ArF resist 1 | Perpendicular | Perpendicular | No residual |
| 13 | Underlayer film 13 | Silicon-containing intermediate layer 1 | ArF resist 1 | Perpendicular | Perpendicular | No residual |
| 14 | Underlayer film 14 | Silicon-containing intermediate layer 1 | ArF resist 1 | Perpendicular | Perpendicular | No residual |
| 15 | Underlayer film 15 | Silicon-containing intermediate layer 1 | ArF resist 1 | Perpendicular | Perpendicular | No residual |
| 16 | Underlayer film 16 | Silicon-containing intermediate layer 1 | ArF resist 1 | Perpendicular | Perpendicular | No residual |
| 17 | Underlayer film 17 | Silicon-containing intermediate layer 1 | ArF resist 1 | Perpendicular | Perpendicular | No residual |
| 18 | Underlayer film 18 | Silicon-containing intermediate layer 1 | ArF resist 1 | Perpendicular | Perpendicular | No residual |
| 19 | Underlayer film 1 | Silicon-containing intermediate layer 1 | ArF resist 1 | Perpendicular | Perpendicular | No residual |
| 20 | Underlayer film 1 | Silicon-containing intermediate layer 1 | ArF resist 1 | Perpendicular | Perpendicular | No residual |
| Comparative Example 1 | Comparartive underlayer film 1 | Silicon-containing intermediate layer 1 | ArF resist 1 | Perpendicular | Perpendicular | intermediate film was stripped, but not underlayer film |

Japanese Patent Application No. 2013-122844 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A photoresist underlayer film-forming composition for use in lithography, comprising a novolak resin comprising recurring units having the general formula (1) and a crosslinker:

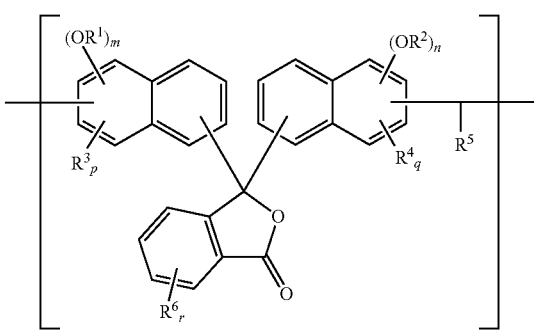

(1)

wherein $R^1$ and $R^2$ are independently hydrogen, an acid labile group, glycidyl group, or a straight, branched or cyclic $C_1$-$C_{10}$ alkyl, acyl or alkoxycarbonyl, $R^3$, $R^4$ and $R^6$ are independently hydrogen, or a straight, branched or cyclic $C_1$-$C_{10}$ alkyl, $C_2$-$C_{10}$ alkenyl, or $C_6$-$C_{10}$ aryl group, which may have a hydroxyl, alkoxy, acyloxy, ether or sulfide moiety, or a halogen atom, hydroxyl group or $C_1$-$C_4$ alkoxy group, $R^5$ is hydrogen, or a straight, branched or cyclic $C_1$-$C_6$ alkyl, a straight, branched or cyclic $C_2$-$C_{10}$ alkenyl, or $C_6$-$C_{12}$ aryl group, which may have a hydroxyl, alkoxy, ether, thioether, carboxyl, alkoxycarbonyl, acyloxy, —COOR or —OR moiety, wherein R is a lactone ring, acid labile group, or -R'-COOR", wherein R' is a single bond or alkylene group, and R" is an acid labile group, m, n, p, q and r each are 1 or 2.

2. The underlayer film-forming composition of claim 1, further comprising an organic solvent.

3. The underlayer film-forming composition of claim 2, further comprising an acid generator.

4. The underlayer film-forming composition of claim 3 wherein the acid generator is one capable of generating acid by pyrolysis.

5. The underlayer film-forming composition of claim 1 wherein the crosslinker is selected from the group consisting of melamine compounds, guanamine compounds, glycoluril compounds and urea compounds having substituted thereon at least one group selected from among methylol, alkoxymethyl and acyloxymethyl groups, epoxy compounds, isocyanate compounds, azide compounds, and compounds having an alkenyl ether group.

6. A process for forming a pattern in a substrate by lithography, comprising the steps of applying the underlayer film-forming composition of claim 1 onto a substrate to form an underlayer film, forming a photoresist film on the underlayer film,
forming a photoresist pattern via exposure and development, and
processing the underlayer film and the substrate with the photoresist pattern serving as mask.

7. The pattern forming process of claim 6, further comprising the step of stripping the underlayer film in alkaline water before or after the step of processing the substrate.

8. The pattern forming process of claim 7 wherein the alkaline water contains 1 to 99% by weight of at least one member selected from the group consisting of ammonia, ammonia hydrogen peroxide water, tetramethylammonium hydroxide, tetraethylammonium hydroxide, tetrapropylammonium hydroxide, tetrabutylammonium hydroxide, choline hydroxide, benzyltrimethylammonium hydroxide, benzyltriethylammonium hydroxide, DBU, DBN, hydroxylamine, 1-butyl-1-methylpyrrolidinium hydroxide, 1-propyl-1-methylpyrrolidinium hydroxide, 1-butyl-1-methylpiperidinium hydroxide, 1-propyl-1-methylpiperidinium hydroxide, mepiquathydroxide, trimethylsulfonium hydroxide, hydrazines, ethylenediamines, and guanidines.

9. A process for forming a pattern in a substrate by lithography, comprising the steps of
applying the underlayer film-forming composition of claim 1 onto a substrate to form an underlayer film,
forming a photoresist film on the underlayer film,
forming a photoresist pattern via exposure and development,
processing the underlayer film with the photoresist pattern serving as mask, and
implanting ions into the substrate.

10. The pattern forming process of claim 9, further comprising the step of stripping the underlayer film in alkaline water after the ion implantation step.

11. The pattern forming process of claim 9, further comprising the step of stripping the underlayer film in alkaline water at pH 9 or higher.

12. A process for forming a pattern in a substrate by lithography, comprising the steps of
applying the underlayer film-forming composition of claim 1 onto a substrate to form an underlayer film,
forming a silicon-containing intermediate film on the underlayer film,
forming a photoresist film on the intermediate film,
forming a photoresist pattern via exposure and development,
processing the intermediate film with the photoresist pattern serving as mask,
processing the underlayer film with the intermediate film serving as mask, and
processing the substrate with the underlayer film serving as mask.

13. A process for forming a pattern in a substrate by lithography, comprising the steps of
applying the underlayer film-forming composition of claim 1 onto a substrate to form an underlayer film,
forming a silicon-containing intermediate film on the underlayer film,
forming a photoresist film on the intermediate film,
forming a photoresist pattern via exposure and development,
processing the intermediate film with the photoresist pattern serving as mask,
processing the underlayer film with the intermediate film serving as mask, and
implanting ions into the substrate with the underlayer film serving as mask.

14. A photoresist underlayer film-forming composition for use in lithography, consisting of a novolak resin comprising recurring units having the general formula (1), a crosslinker and an organic solvent:

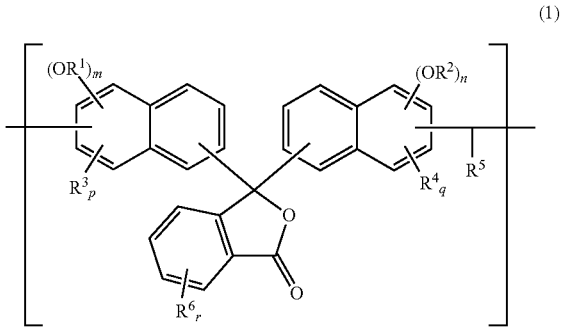

wherein $R^1$ and $R^2$ are independently hydrogen, an acid labile group, glycidyl group, or a straight, branched or cyclic $C_1$-$C_{10}$ alkyl, acyl or alkoxycarbonyl,
$R^3$, $R^4$ and $R^6$ are independently hydrogen, or a straight, branched or cyclic $C_1$-$C_{10}$ alkyl, $C_2$-$C_{10}$ alkenyl, or $C_6$-$C_{10}$ aryl group, which may have a hydroxyl, alkoxy, acyloxy, ether or sulfide moiety, or a halogen atom, hydroxyl group or $C_1$-$C_4$ alkoxy group,
$R^5$ is hydrogen, or a straight, branched or cyclic $C_1$-$C_6$ alkyl, a straight, branched or cyclic $C_2$-$C_{10}$ alkenyl, or $C_6$-$C_{12}$ aryl group, which may have a hydroxyl, alkoxy, ether, thioether, carboxyl, alkoxycarbonyl, acyloxy, —COOR or —OR moiety, wherein R is a lactone ring, acid labile group, or -R'-COOR", wherein R' is a single bond or alkylene group, and R" is an acid labile group,
m, n, p, q and r each are 1 or 2.

15. The underlayer film-forming composition of claim 14 wherein the crosslinker is selected from the group consisting of melamine compounds, guanamine compounds, glycoluril compounds and urea compounds having substituted thereon at least one group selected from among methylol, alkoxymethyl and acyloxymethyl groups, epoxy compounds, isocyanate compounds, azide compounds, and compounds having an alkenyl ether group.

16. A photoresist underlayer film-forming composition for use in lithography, consisting of a novolak resin comprising recurring units having the general formula (1), an acid generator, a crosslinker and an organic solvent:

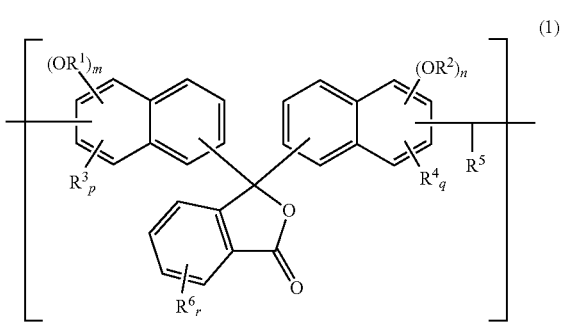

wherein $R^1$ and $R^2$ are independently hydrogen, an acid labile group, glycidyl group, or a straight, branched or cyclic $C_1$-$C_{10}$ alkyl, acyl or alkoxycarbonyl, $R^3$, $R^4$ and $R^6$ are independently hydrogen, or a straight, branched or cyclic $C_1$-$C_{10}$ alkyl, $C_2$-$C_{10}$ alkenyl, or $C_6$-$C_{10}$ aryl group, which may have a hydroxyl, alkoxy, acyloxy, ether or sulfide moiety, or a halogen atom, hydroxyl group or $C_1$-$C_4$ alkoxy group, $R^5$ is hydrogen, or a straight, branched or cyclic $C_1$-$C_6$ alkyl, a straight, branched or cyclic $C_2$-$C_{10}$ alkenyl, or $C_6$-$C_{12}$ aryl group, which may have a hydroxyl, alkoxy, ether, thioether, carboxyl, alkoxycarbonyl, acyloxy, —COOR or —OR moiety, wherein R is a lactone ring, acid labile group, or -R'-COOR", wherein R' is a single bond or alkylene group, and R" is an acid labile group, m, n, p, q and r each are 1 or 2.

17. The underlayer film-forming composition of claim 16 wherein the crosslinker is selected from the group consisting of melamine compounds, guanamine compounds, glycoluril compounds and urea compounds having substituted thereon at least one group selected from among methylol, alkoxymethyl and acyloxymethyl groups, epoxy compounds, isocyanate compounds, azide compounds, and compounds having an alkenyl ether group.

18. The underlayer film-forming composition of claim 16 wherein the acid generator is one capable of generating acid by pyrolysis.

* * * * *